United States Patent
Sugawara et al.

(10) Patent No.: US 7,517,812 B2
(45) Date of Patent: Apr. 14, 2009

(54) METHOD AND SYSTEM FOR FORMING A NITRIDED GERMANIUM-CONTAINING LAYER USING PLASMA PROCESSING

(75) Inventors: Takuya Sugawara, Palo Alto, CA (US); Paul C. McIntyre, Sunnyvale, CA (US)

(73) Assignees: Tokyo Electron Limited, Tokyo (JP); The Board of Trustees of the Leland Stanford Junior University, Palo Alto, CA (US)

(*) Notice: Subject to any disclaimer, the term of this patent is extended or adjusted under 35 U.S.C. 154(b) by 322 days.

(21) Appl. No.: 11/263,402

(22) Filed: Oct. 31, 2005

(65) Prior Publication Data
US 2007/0099435 A1    May 3, 2007

(51) Int. Cl.
H01L 21/469    (2006.01)
(52) U.S. Cl. .................................. 438/765; 438/767
(58) Field of Classification Search ................ 438/768, 438/765
See application file for complete search history.

(56) References Cited

U.S. PATENT DOCUMENTS

| | | | |
|---|---|---|---|
| 4,579,623 A | 4/1986 | Suzuki et al. | |
| 5,366,585 A | 11/1994 | Robertson et al. | |
| 6,426,305 B1 | 7/2002 | Chou et al. | |
| 6,730,566 B2 | 5/2004 | Niimi et al. | 438/275 |
| 6,787,861 B2 | 9/2004 | Lucovsky et al. | 257/410 |
| 2005/0070122 A1 | 3/2005 | Gousev et al. | 438/765 |
| 2005/0106893 A1 | 5/2005 | Wilk | 438/758 |
| 2005/0118836 A1 | 6/2005 | Chou et al. | 438/786 |
| 2005/0161434 A1* | 7/2005 | Sugawara et al. | 216/67 |

FOREIGN PATENT DOCUMENTS

EP    1361605 A1    11/2003

OTHER PUBLICATIONS

Fujisaki, Yohihisa "Damage-Free and Hydrogen-Free Nitridation of Silicon Substrate by Nitrogen Radical Source" Jpn. J. Appl. Phys. vol. 39 (2000) pp. L1075-L1077.*
Wolf, Stanley "Silicon Processing for the VLSI Era" vol. 1 2nd ed. p. 708.*
Maeda, Tatsuro "Pure Germanium Nitride formation by atomic nitrogen radicals for application to Ge metal-insulator-semiconductor structures" Journal of Applied Physics 100 pp. 014101-1 through 7.*

(Continued)

*Primary Examiner*—Fernando L Toledo
*Assistant Examiner*—Grant S Withers
(74) *Attorney, Agent, or Firm*—Wood, Herron & Evans, LLP

(57) ABSTRACT

A method and system for forming a nitrided germanium-containing layer by plasma processing. The method includes providing a germanium-containing substrate in a process chamber, generating a plasma from a process gas containing $N_2$ and a noble gas, where the plasma conditions are selected effective to form plasma excited $N_2$ species while controlling formation of plasma excited N species, and exposing the substrate to the plasma to form a nitrided germanium-containing layer on the substrate. A method is also provided that includes exposing a germanium-containing dielectric layer to liquid or gaseous $H_2O$ to alter the thickness and chemical composition of the layer.

19 Claims, 15 Drawing Sheets

OTHER PUBLICATIONS

Igarashi et al., *Preparation of Germanium Nitride Films on the Stained Germanium Crystal Surface*, Japanese Journal of Applied Physics, vol. 7, 1968, pp. 300-301.

Hua et al., *Thin Germanium Nitride Films Grown by Thermal Reaction Process*, Journal of Applied Physics, vol. 53, No. 12, 1982, pp. 8969-8973.

Hu et al., In Situ *Investigation of Temperature and Bias Dependent Effects on the Oxide Growth of Si and Ge in an Electron Cyclotron Resonance*, J. Vac. Sci. Technol. A., vol. 11, No. 4, 1993, pp. 900-904.

Wang et al., *Electron Cyclotron Resonance Plasma and Thermal Oxidation Mechanisms of Germanium*, J. Vac. Sci. Technol. A., vol. 12, No. 4, 1994, pp. 1309-1314.

Sekine et al., *Silicon Ntride Film Growth for Advanced Gate Dielectric at Low Temperature Employing High-Density and Low-Energy Ion Bombardment*, J. Vac. Sci. Technol. A, vol. 17, No. 5, 1999, pp. 3129-3133.

Prabhakaran et al., *Distinctly Different Thermal Decomposition Pathways of Ultrathin Oxide Layer on Ge and Si Surfaces*, Applied Physics Letters, vol. 76, No. 16, 2000, pp. 2244-2246.

Johnson et al., *New Approach for the Fabrication of Device-Quality $Ge/GeO_2/SiO_2$ Interfaces Using Low Temperature Remote Plasma Processing*, J. Vac. Sci. Technol. A., vol. 18, No. 4, 2000, pp. 1230-1233.

Chan et al., *Development of Procedures for Obtaining Clean, Low-Defect-Density Ge(100) Surfaces*, J. Vac. Sci. Technol. A., vol. 19, No. 3, 2001, pp. 976-981.

Chui et al., *A Germanium NMOSFET Process Integrating Metal Gate and Improved Hi-K Dielectrics*, IEDM, 2003, Technical Digest pp. 437-440.

Maeda et al., *Ge Metal-Insulator-Semiconfuctor Structures with $Ge_3N_4$ Dielectrics by Direct Nitridation of Ge Substrates*, Applied Physics Letters, vol. 85, No. 15, 2004, pp. 3181-3183.

Sugawara et al., *Characterization of Ultra Thin Oxynitride Formed by Radical Nitridation with Slot Plane Antenna Plasma*, Japanese Journal of Applied Physics, vol. 44, No. 3, 2005, pp. 1232-1236.

European Patent Office, Invitation to Pay Additional Fees for corresponding PCT Application No. PCT/US2006/042298, dated Mar. 5, 2007, 6 pgs.

Niimi et al., Reaction Pathways in Remote Plasma Nitridation of Ultrathin SiO2 Films, Journal of Applied Physics, American Institute of Physics, Jan. 1, 2002, pp. 48-55, vol. 91, No. 1, New York.

Gregory et al., Electrical Characteriization of Some Native Insulators on Germanium, Materials Research Society Symposium Proceedings, Materials Research Society, 1987, pp. 310-311, vol. 76, Pittsburgh, PA.

Maikap et al., NO/O2/NO Plasma-Grown Oxynitride Films on Strained Si1-xGex, Electronics Letters, IEE, Jul. 8, 1999, pp. 1202-1203, vol. 35, No. 14, Stevenage, Great Britain.

Sugawara et al., Mechanism of Germanium Plasma Nitridation, Journal of Vacuum Science & Technology, AIP for American Vacuum Soc., Sep. 27, 2006, pp. 2442-2448, vol. 24, No. 5.

European Patent Office, Invitation to Pay Additional Fees from related PCT Application No. PCT/US2006/039481, dated Jul. 17, 2007, 7 pp.

European Patent Office, International Search Report and Written Opinion from related PCT Application No. PCT/US2006/039481, dated Nov. 2, 2007, 23 pp.

European Patent Office, International Search Report and Written Opinion from corresponding PCT Application No. PCT/US2006/042298, dated Apr. 24, 2007, 19 pp.

* cited by examiner

METHOD AND SYSTEM FOR FORMING A NITRIDED GERMANIUM-CONTAINING LAYER USING PLASMA PROCESSING

CROSS REFERENCE TO RELATED APPLICATION

This application is related to co-pending U.S. patent application Ser. No. 10/920,990 filed Aug. 18, 2004 and entitled "Method and System for Modifying a Gate Dielectric Stack Containing a High-K Layer Using Plasma Processing," and to co-pending U.S. patent application Ser. No. 11/263,619 filed on even date herewith and entitled "Method And System For Forming a Nitrided Germanium-Containing Layer Using Plasma Processing," the disclosures of which are incorporated herein by reference in their entirety as if completely set forth herein below.

FIELD OF THE INVENTION

The present invention relates to substrate processing, and more particularly, to a plasma processing method and system for forming a nitrided germanium-containing layer for dielectric applications.

BACKGROUND OF THE INVENTION

In the semiconductor industry, the minimum feature sizes of microelectronic devices are well into the deep sub-micron regime to meet the demand for faster and lower power semiconductor devices. The downscaling of complimentary metal-oxide-semiconductor (CMOS) devices imposes scaling constraints on the gate dielectric material where the thickness of the conventional $SiO_2$ gate dielectric is approaching its physical limits. To maintain the projected performance enhancement from one generation of devices to the next, to improve device reliability and to reduce electrical leakage from the gate dielectric to the transistor channel during operation of the device, semiconductor transistor technology requires dielectric materials with a higher dielectric constant than that of $SiO_2$, and that allow increased physical thickness of the gate dielectric layer while maintaining a low equivalent oxide thickness (EOT).

Low temperature processing of semiconductors is of interest for the downscaling of future ultra large scale integration (ULSI) semiconductor devices. Plasma oxidation and nitridation, utilizing oxygen and nitrogen plasma, is a promising low temperature technique to form oxynitride gate dielectric films, buried oxynitride layers of germanium/silicon on insulator (GOI/SOI) structures, or nitrided dielectric layers on floating gates. While formation of nitrided dielectric layers by plasma processing has been reported, little details on the active plasma species have been disclosed, including how plasma sources and plasma processing conditions may be chosen to select plasma species that form the desired nitrided dielectric layers.

Silicon (Si) oxynitride layers are viewed as one of the most promising alternate materials to replace the $SiO_2$ gate oxide, while still being compatible with the Si technology. Thin oxynitride layers are usually formed either by thermal processing methods or by plasma based methods. Nitriding ultra-thin oxide layers to form oxynitride layers, has been shown to alleviate various limitations encountered with oxide layers. The improvements include increased resistance to boron penetration, lower tunneling leakage current and interface-state generation, and less threshold voltage shift under constant current conditions. The improved dielectric properties that are observed for oxynitride layers are attributed to the fact that the nitrogen atoms at the surface of the $SiO_2/Si$ act as a barrier to boron penetration and can reduce strain at the $SiO_2/Si$ interface.

In addition to Si based MOS technology, germanium (Ge) based MOS technology is a likely candidate for future CMOS technology, including the 22 nm technology node and beyond, because of its high carrier mobility, small band gap for voltage scaling, and high solubility of p-type dopants. In order to integrate Ge based technology into semiconductor devices, for example gate stacks, it may be necessary to form a high quality passivation layer on the Ge surface to improve interface characteristics and to avoid intermixing of Ge and the gate dielectric film.

Germanium oxynitride layers may contain $GeO_2$, which is thermally unstable and water soluble. Since wafers go through several wet chemical treatments during a manufacturing process, the presence of $GeO_2$ can affect the properties of the integrated germanium oxynitride layers. Thus, processing methods are needed that allow formation of a germanium oxynitride layer with a selected chemical bonding environment (e.g., $GeO_2$ vs GeO), in addition to tunable nitrogen concentration and control of the layer thickness.

SUMMARY OF THE INVENTION

A method and system is provided for forming a nitrided dielectric layer of a semiconductor device using plasma processing. Embodiments of the current invention provide a method for selecting a plasma source and plasma conditions effective for forming nitrogen species in a plasma nitridation process that enable controlled nitridation of a germanium-containing substrate to form a nitrided germanium-containing layer with a desired thickness, tunable nitrogen concentration, and selected chemical bonding environment. According to one embodiment, a germanium oxynitride layer containing a GeO bonding environment is formed. Embodiments of the present invention also provide a method of exposing a germanium-containing dielectric layer to liquid or gaseous $H_2O$ to alter the thickness and chemical composition of the layer.

Embodiments of the invention include a method and system that enable selecting plasma species that form a nitrided dielectric layer with desired properties through plasma nitridation of a substrate. The nitrided dielectric layer can be a nitrided germanium-containing layer, including a germanium nitride layer, a germanium oxynitride layer, a silicon germanium nitride layer, or a silicon germanium oxynitride layer.

According to one embodiment of the invention, the method includes providing a germanium-containing substrate in a process chamber, generating a plasma with an inductively coupled plasma (ICP) plasma source from a process gas containing $N_2$ and a noble gas, and selecting the plasma conditions effective to form plasma excited $N_2$ species and plasma excited N species, and exposing the germanium-containing substrate to the plasma to form a nitrided germanium-containing layer on the germanium-containing layer.

According to an embodiment of the invention, the ICP processed germanium-containing layer contains a germanium oxynitride layer, and the method further includes exposing the germanium oxynitride layer to liquid $H_2O$ or gaseous $H_2O$ to reduce the thickness and decrease the nitrogen-concentration of the germanium oxynitride layer. According to an embodiment of the invention, the nitrided germanium-containing layer contains nitrogen species soluble in $H_2O$ and oxygen species insoluble in $H_2O$.

DETAILED DESCRIPTION OF SEVERAL EMBODIMENTS OF THE INVENTION

Nitrided germanium-containing layers and nitrided silicon-containing layers may be used as dielectric layers in future semiconductor devices. While formation of such dielectric layers by plasma processing has been reported, little experimental details have been disclosed, including how plasma sources and plasma processing conditions may be chosen to select plasma species that form the desired nitrided dielectric layers. For example, germanium oxynitride layers may contain one or more Ge—O and Ge—N species with different chemical bonding environments and different chemical properties. The Ge—O species may include GeO and/or $GeO_2$, and the Ge—N species may include GeN and/or $Ge_3N_4$.

Embodiments of the current invention provide a method and system for selecting a plasma source and plasma conditions effective for forming nitrogen species in a plasma nitridation process that enable controlled nitridation of a germanium-containing substrate to form a nitrided germanium-containing layer with a desired thickness, tunable nitrogen concentration, and selected chemical bonding environment.

According to an embodiment of the invention, a nitrided germanium-containing layer is formed by plasma nitridation of a germanium-containing substrate, where the plasma nitridation process incorporates nitrogen into the bulk of the germanium-containing substrate exposed to the plasma environment. As opposed to nitridation processes that simply modify the surface of a germanium-containing substrate without significant bulk modification, embodiments of invention incorporate nitrogen into the bulk of the germanium-containing substrate. In one example, a thickness of the nitrided layer can be about 50 angstrom. The germanium-containing substrate can, for example, include germanium (Ge) or silicon germanium (SiGe). The nitrided germanium-containing layer can, for example, include a germanium oxynitride layer (GeON), a germanium nitride layer (GeN), a silicon germanium oxynitride layer (SiGeON), or a silicon germanium nitride layer (SiGeN).

Figure 12:
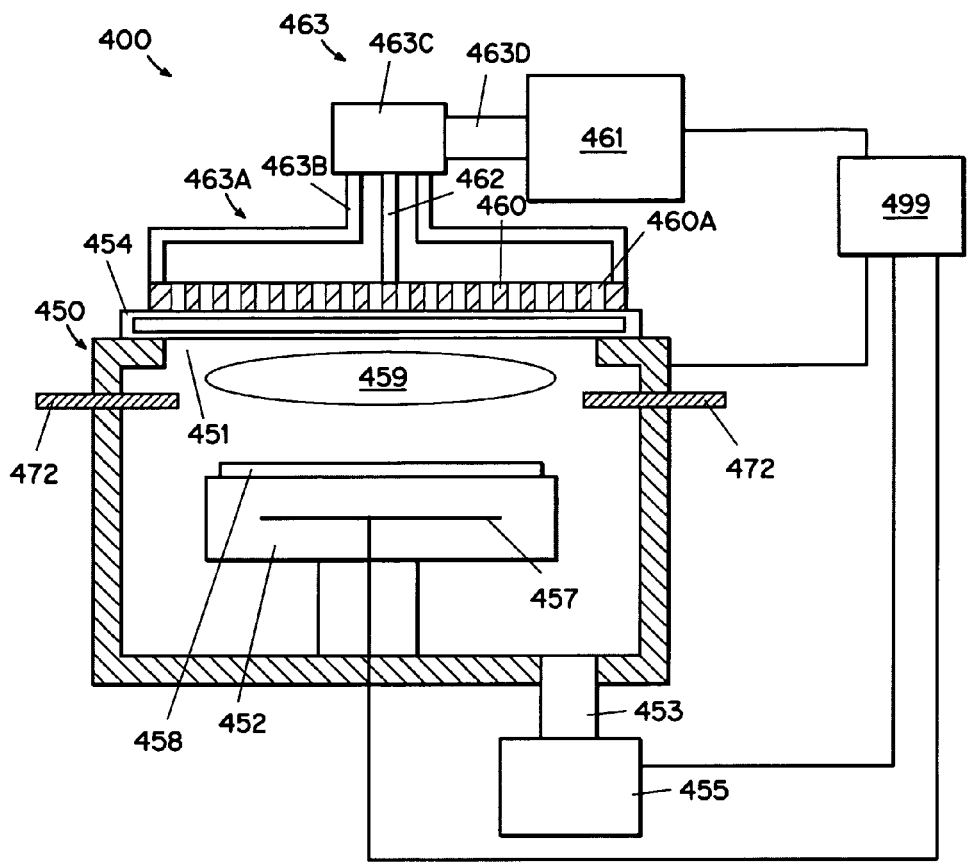
FIG. 12 is a simplified block-diagram of a plasma processing system containing a RLSA plasma source according to an embodiment of the invention.

According to one embodiment of the invention, a method is provided for generating a plasma in a plasma processing system from a process gas containing $N_2$ and a noble gas, where the plasma conditions are selected effective to form plasma excited $N_2$ species while suppressing formation of plasma excited N species. In one example, the plasma processing system may contain a radial line slot antenna (RLSA) plasma source. An exemplary plasma processing system containing a RLSA plasma source is depicted in FIG. 12. However, embodiments of the invention are not limited to a RLSA plasma source as other plasma sources and plasma conditions capable of forming plasma excited $N_2$ species while suppressing formation of plasma excited N species are contemplated and may be used.

According to another embodiment of the invention, a method is provided for forming a dielectric layer by first providing a germanium-containing dielectric layer that contains a greater amount of nitrogen species soluble in $H_2O$ than nitrogen species insoluble in $H_2O$ and a greater amount of oxygen species insoluble in $H_2O$ than oxygen species soluble in $H_2O$. As mentioned above, one method of providing the dielectric layer is by plasma processing using a ICP plasma source, but this embodiment of the invention is not so limited.

Other methods may be determined by one skilled in the art to provide the desired species. The germanium-containing dielectric layer may be a germanium nitride layer, a germanium oxynitride layer, a silicon germanium nitride layer, a silicon germanium oxynitride layer, or a mixture of germanium and a high-k material. The high-k material may comprise $Ta_2O_5$, $TiO_2$, $ZrO_2$, $HfO_2$, $Al_2O_3$, $Y_2O_3$, $HfSiO_x$, $ZrSiO_x$, $TaSiO_x$, $SrO_x$, $SrSiO_x$, $LaO_x$, $LaSiO_x$, $YO_x$, or $YSiO_x$, or a combination of two or more thereof.

Figure 1A:
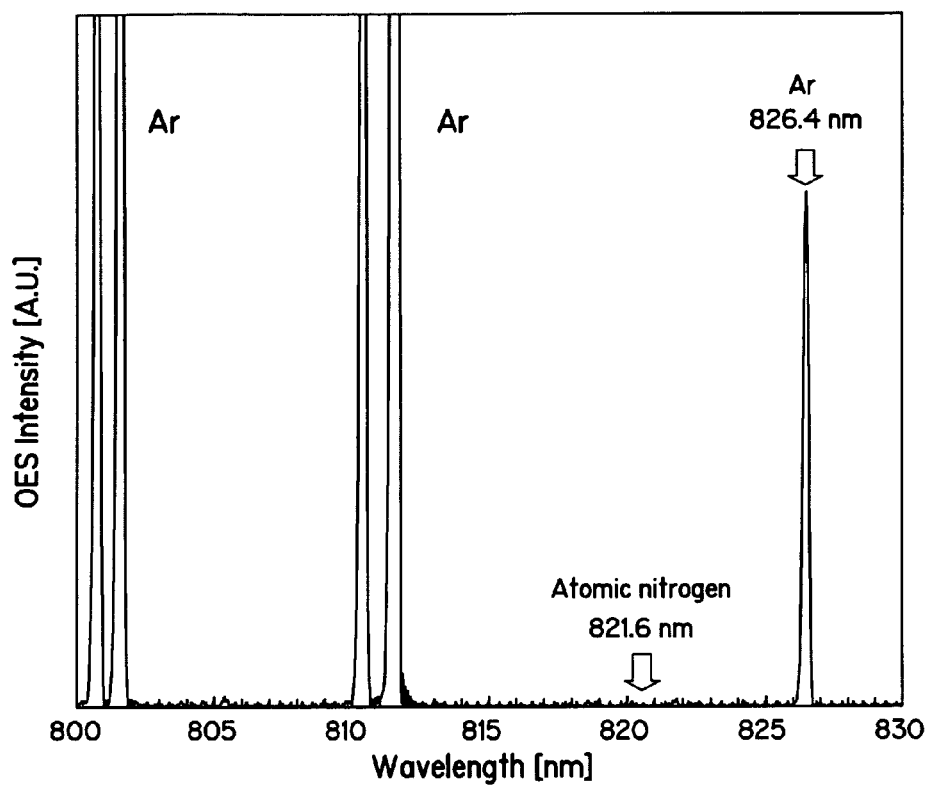
FIGS. 1A and 1B show optical emission intensity as a function of wavelength for a plasma generated by a radial line slot antenna (RLSA) plasma source from a process gas containing $N_2$ and Ar.
Figure 1B:
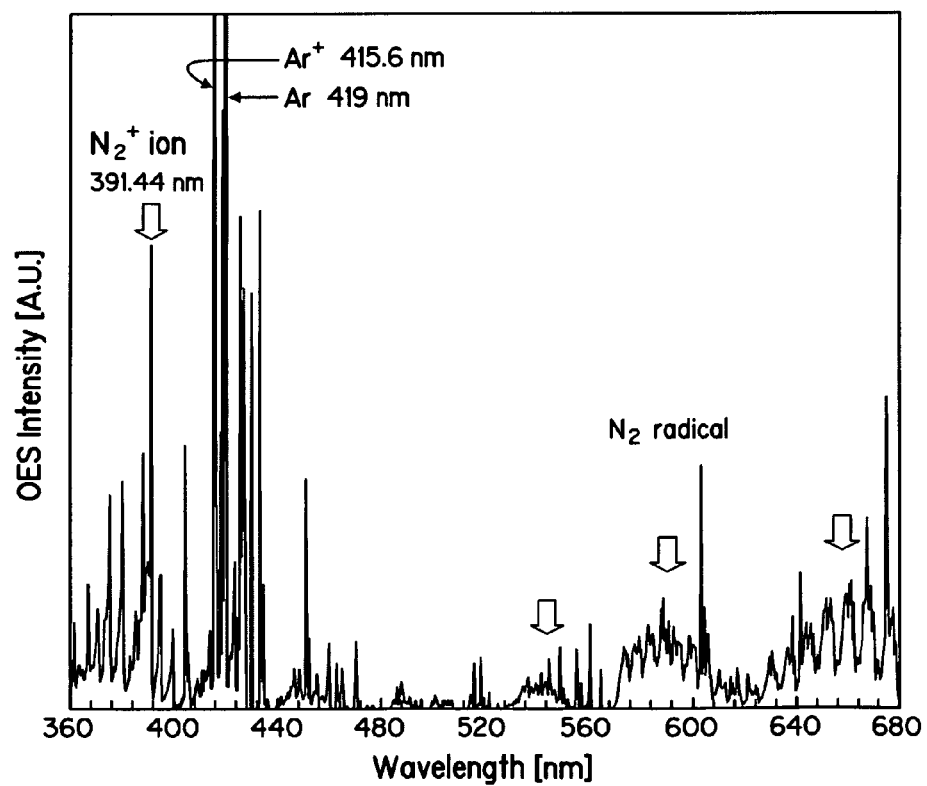

FIGS. 1A and 1B show optical emission intensity as a function of wavelength for a plasma generated by a RLSA plasma source from a process gas containing $N_2$ and Ar. FIG. 1A shows the optical emission from 800 nm to 830 nm and displays features characteristic of plasma excited Ar, but features characteristic of plasma excited N radicals at 821.6 nm are clearly absent from the plasma environment. Further, FIG. 1B shows optical emission from 360 nm to 680 nm where, in addition to features of plasma excited Ar, features characteristic of plasma excited $N_2^+$ at a wavelength of 391.44 nm and broad features characteristic of $N_2$ radicals at wavelengths greater than about 520 nm are clearly visible. In summary, FIGS. 1A and 1B show that a RLSA plasma source allows for selecting plasma conditions effective to form plasma excited $N_2$ species, including $N_2^+$ and $N_2$ radicals, while suppressing formation of plasma excited N species, including N radicals. Furthermore, FIGS. 1A and 1B demonstrate that optical emission spectroscopy (OES) can be utilized to monitor the presence or absence of a variety of nitrogen-containing species in the plasma, including $N_2^+$, $N_2$ radicals, and N radicals. In particular, OES may be used to monitor nitrogen-containing species in the plasma as process parameters, including process pressure, plasma power, and process gas composition, are selected and adjusted. In one example, OES monitoring during plasma processing may be correlated with measured properties of the nitrided germanium-containing layers. The measured properties can include layer thickness, layer composition (including nitrogen-concentration), and chemical bonding environment. The measured chemical bonding environment includes identification of the bonding structure within a nitrided layer, including the presence of GeO, $GeO_2$, or GeON species in the nitrided layer.

Figure 2A:
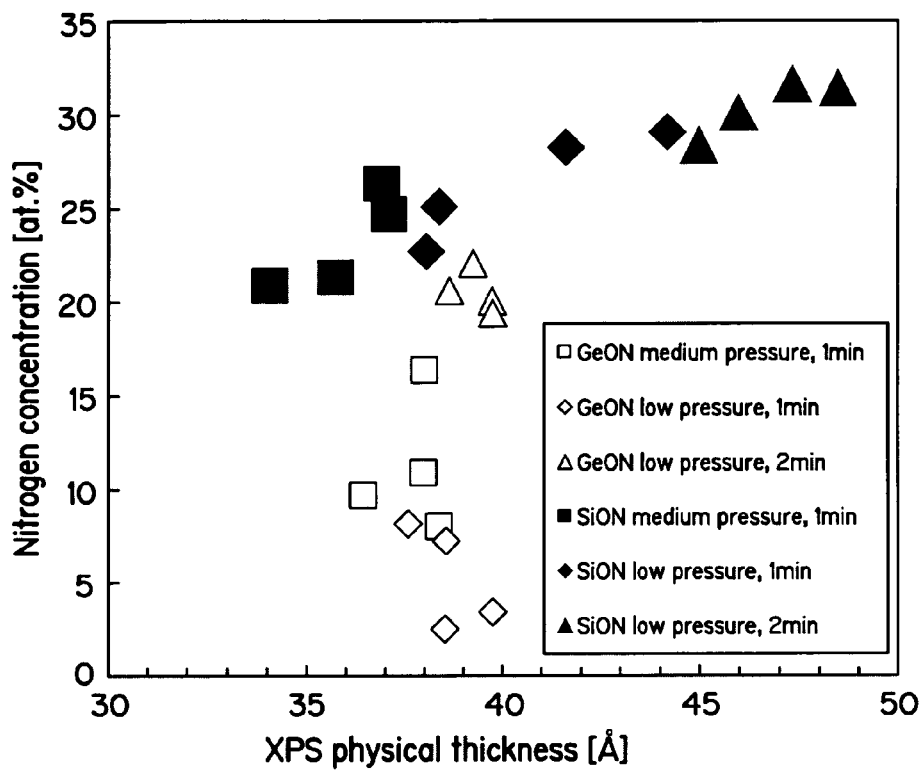
FIG. 2A shows nitrogen concentration of germanium oxynitride layers and silicon oxynitride layers as a function of layer thickness according to embodiments of the invention.

FIG. 2A shows nitrogen concentration (in atomic percent) of germanium oxynitride layers and silicon oxynitride layers as a function of layer thickness (XPS physical thickness). The germanium oxynitride layers and silicon oxynitride layers were formed as follows: as-received Ge(100) and Si(100) substrates where cleaned using a 30 sec rinse in a 1:50 $HF:H_2O$ solution followed by a 30 sec rinse in $H_2O$. This cleaning procedure was performed 5 times. After cleaning, the Ge(100) and Si(100) substrates were plasma processed in a plasma processing system containing a RLSA plasma source. The plasma processing was done at low pressure (P=15 mTorr) and medium pressure (P=50 mTorr), utilizing plasma exposure times of 1 min and 2 min. The plasma processing did not result in heating of the substrate by the plasma environment. The nitrogen concentration and the thickness of the nitrided layers were measured by X-ray Photoemission Spectroscopy (XPS).

FIG. 2A shows that the nitrogen concentration in the germanium oxynitride layers could be varied from about 2 atomic percent for a 1 min plasma exposure to about 22 atomic percent for a 2 min RLSA plasma exposure at low pressure. The thickness of the germanium oxynitride layers was between about 37 angstrom and about 40 angstrom. For comparison, the nitrogen concentration in the silicon oxynitride layers varied from about 20 atomic percent to about 30 atomic percent and the thickness varied from about 35 angstrom to about 49 angstrom.

Figure 2B:
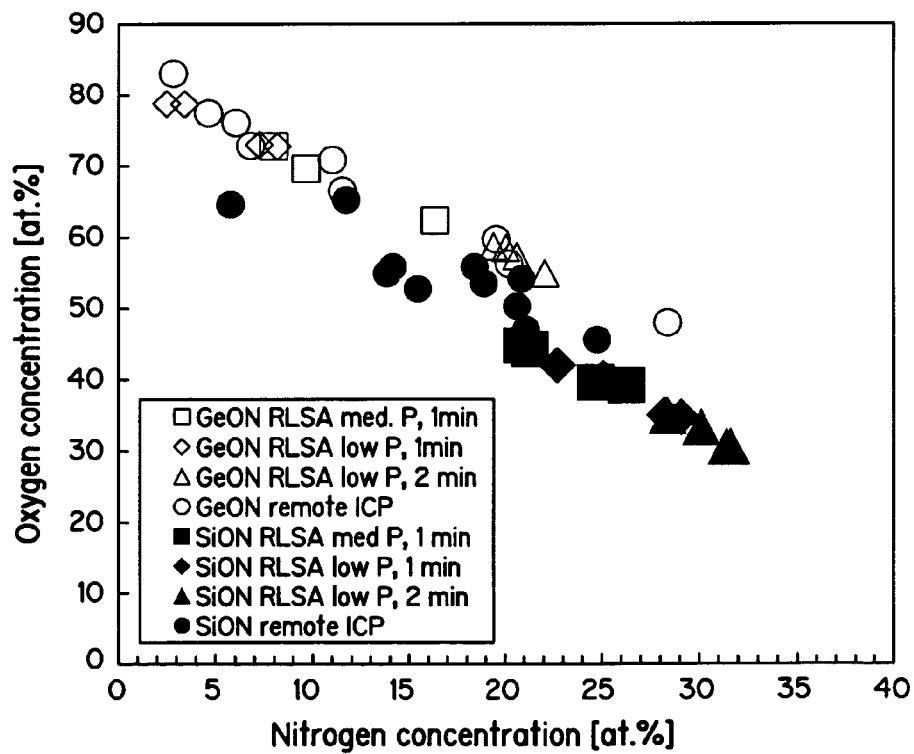
FIG. 2B shows relationship of nitrogen and oxygen concentration of germanium oxynitride layers and silicon oxynitride layers.

FIG. 2B shows relationship between nitrogen concentration and oxygen concentration in germanium oxynitride layers and silicon oxynitride layers. The layers were formed by plasma processing of substrates using a RLSA plasma source, and a remote inductively coupled plasma (ICP) plasma source. Exemplary ICP plasma sources are described in FIGS. 13 and 14. Although an oxygen-containing gas was not added to the process gas, the nitrided germanium-containing layers and the nitrided silicon-containing layers contained oxygen, and are therefore referred to as germanium oxynitride layers and silicon oxynitride layers, respectively. It has been reported that oxidation of Ge substrates is difficult to avoid unless the process chamber is designed for high vacuum processing (e.g., process pressures below about 10 mTorr, or lower). It is contemplated that the oxygen in the germanium oxynitride layers and silicon oxynitride layers originates from an oxygen-containing background gas (e.g., $O_2$ or $H_2O$) plasma sputtered from surfaces of the plasma processing system, from oxygen-containing impurities in the process gas, or from an oxide layer or adsorbed oxygen-containing species (e.g., $O_2$ or $H_2O$) on the Ge(100) and Si(100) substrates. In addition, it is contemplated that the oxygen in germanium oxynitride layers and silicon oxynitride layers may at least partly originate from exposure to air between the plasma nitridation process and the ex-situ XPS measurements. Thus, the oxygen XPS signals may be partly due to native oxide growth after the plasma nitridation process. However, the high oxygen concentrations shown in FIG. 2B suggest that native oxide formation may not be the only source of oxygen in the oxynitride layers.

According to one embodiment of the invention, nitrided germanium-containing layers (e.g., GeN or SiGeN) that do not contain a significant amount of oxygen, may be formed by reducing or eliminating the above-mentioned sources of oxygen in the plasma processing system. In one example, the internal surfaces of the plasma processing system, may be made from and/or coated with corrosion resistant and high melting point materials such as alumina, yttria, zirconia, silicon carbide or aluminum nitride. In another example, one or more gas purifiers may be utilized to reduce or eliminate oxygen contamination in the process gas. In yet another example, components of the plasma processing system, including process chamber walls and gas lines, may be heated to desorb any adsorbed water. In still another example, a native oxide layer may be removed from a substrate by exposing the substrate to a plasma from a cleaning gas (e.g., $H_2$ and Ar) prior to the plasma nitridation process. The plasma cleaning process may also remove adsorbed water from internal surfaces of the plasma processing system.

Figure 2C:
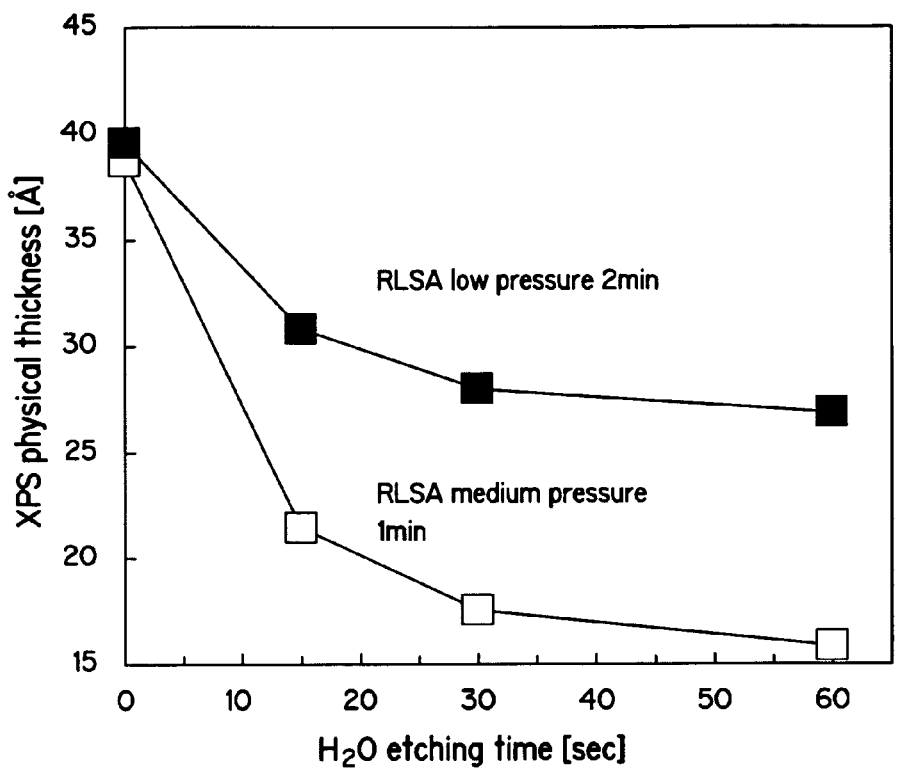
FIGS. 2C and 2D show thickness and nitrogen concentration, respectively, of germanium oxynitride layers as a function of $H_2O$ etching time according to an embodiment of the invention.
Figure 2D:
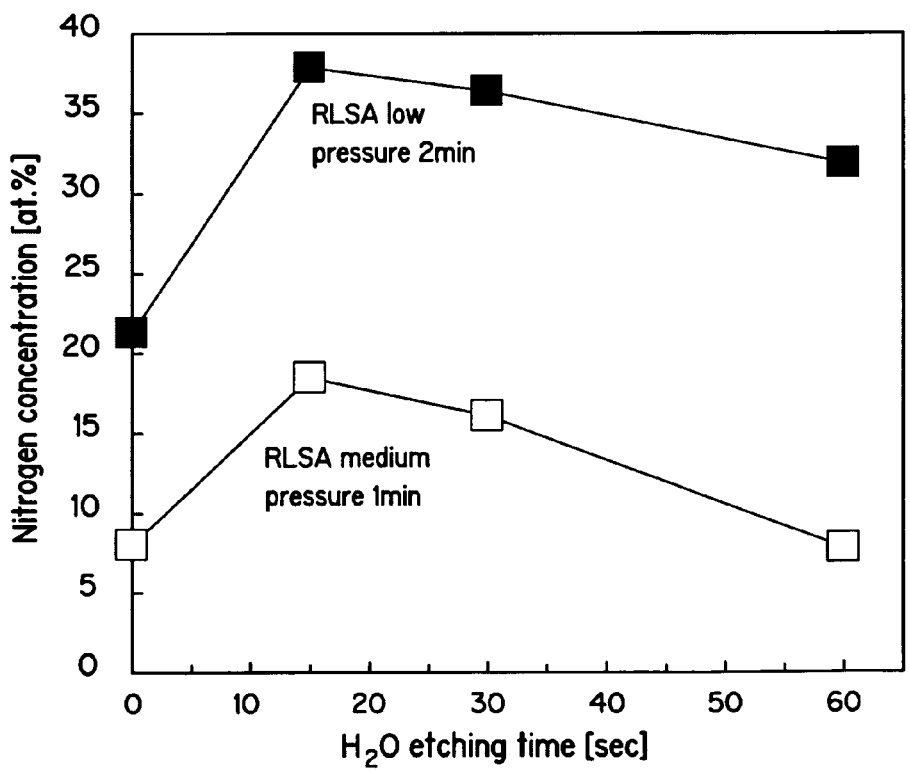

FIGS. 2C and 2D show thickness and nitrogen concentration, respectively, of germanium oxynitride layers as a function of $H_2O$ etching time. The germanium oxynitride layers were formed by 2 min low pressure RLSA plasma processing and 1 min medium pressure RLSA plasma processing. Thereafter, the germanium oxynitride layers were etched in liquid $H_2O$ for a desired time period and subsequently dried with dry $N_2$ flow and the layer thickness and nitrogen concentration measured by XPS. FIGS. 2C and 2D show that the thickness and the nitrogen concentration of the germanium oxynitride layers can be varied by utilizing the solubility of the layers in $H_2O$. In FIGS. 2C and 2D, the etched layers have reduced thickness and increased nitrogen concentration compared to unetched layers. The solubility of germanium oxynitride layers is further discussed in reference to FIGS. 10 and 11.

Figure 3:
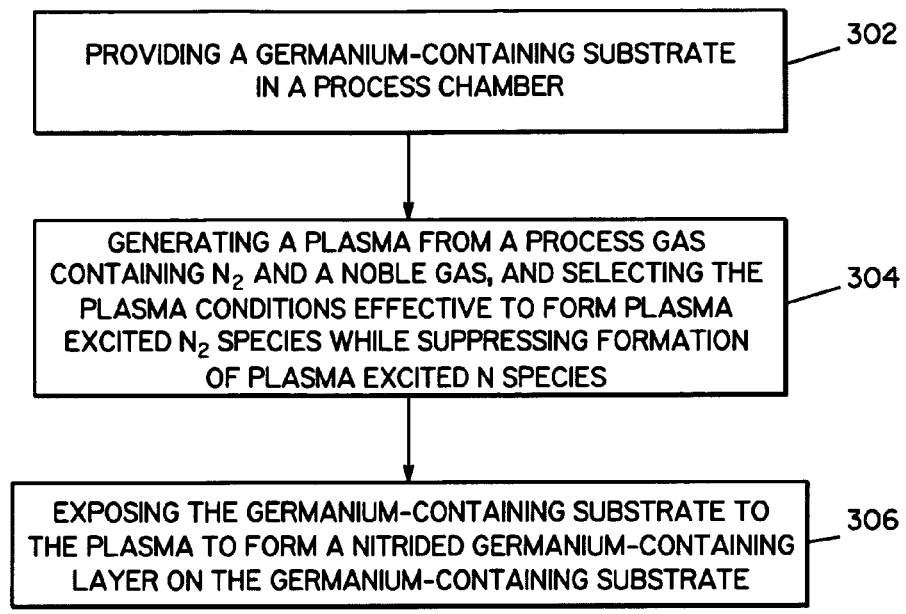
FIG. 3 is a process flow chart for forming a nitrided germanium-containing layer according to an embodiment of the invention.

FIG. 3 is a process flow chart for forming a nitrided germanium-containing layer according to an embodiment of the invention. In step 302, a germanium-containing substrate is provided in a process chamber of a plasma processing system. The plasma processing system can, for example, contain a RLSA plasma source. The germanium-containing substrate can, for example, be a germanium substrate or a silicon germanium substrate. According to another embodiment of the invention, the germanium-containing substrate may contain an oxide layer or an oxygen-containing species adsorbed on a surface of the germanium-containing substrate. According to yet another embodiment of the invention, the germanium-containing substrate may contain a base dielectric layer on the germanium-containing substrate. The base dielectric layer can, for example, contain germanium and oxygen (e.g., GeO or $GeO_2$), or germanium, silicon, and oxygen (e.g., GeSiO).

In step 304, a plasma is generated from a process gas containing $N_2$ and a noble gas. The noble gas can, for example, be Ar. According to another embodiment of the invention, the process gas can contain $N_2$, a noble gas, and $H_2$. According to still another embodiment of the invention, the process gas can contain $N_2$, a noble gas, and an oxygen-containing gas (e.g., $O_2$ or $H_2O$). According to yet another embodiment of the invention, the process gas can contain forming gas (i.e., ~5% $H_2$ in $N_2$) and a noble gas. In step 304, the plasma conditions are selected effective to form plasma excited $N_2$ species while suppressing formation of plasma excited N species. According to one embodiment of the invention, the plasma excited $N_2$ species include $N_2^+$ ions and $N_2$ radicals, and the plasma excited N species include N radicals. For a RSLA plasma source, exemplary plasma conditions can include a process pressure below about 50 mTorr and microwave power between about 0.5 W/cm$^2$ and about 4 W/cm$^2$.

In step 306, the germanium-containing substrate is exposed to the plasma to form a nitrided germanium-containing layer on the germanium containing substrate. The nitrided germanium-containing layer can include a germanium nitride layer, a germanium oxynitride layer, a silicon germanium nitride layer, or a silicon germanium oxynitride layer. According to one embodiment of the invention, the substrate can be maintained at a temperature between room temperature and about 500° C. during the exposing.

As a result of suppressing formation of the plasma excited N species, the nitrided germanium-containing layer may contain a higher content of nitrogen species that are insoluble in $H_2O$, such as $Ge_3N_4$, and a lower content of nitrogen species that are soluble in $H_2O$, such as GeN. In addition, for oxynitride layers, the nitrided layer may contain a higher content of oxygen species that are soluble in $H_2O$, such as $GeO_2$, and a lower content of oxygen species that are insoluble in $H_2O$, such as GeO. Consequently, subsequent processing with $H_2O$ may be used to remove the soluble species, if desired. In an oxynitride layer, removal of the soluble oxygen species may effectively increase the nitrogen content.

Figure 13:
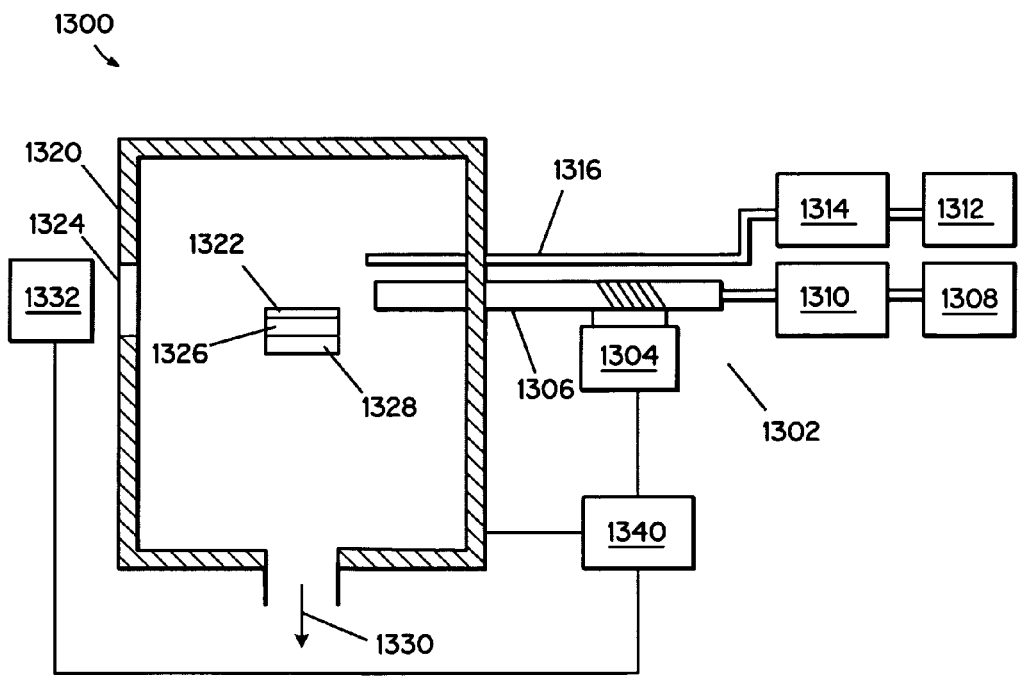
FIG. 13 is a simplified block-diagram of a plasma processing system containing a remote ICP plasma source according to an embodiment of the invention.

According to one embodiment of the invention, a method is provided for generating a plasma in a plasma processing system from a process gas containing $N_2$ and a noble gas, where the plasma conditions are selected effective to form plasma excited $N_2$ species and plasma excited N species. In one example, the plasma processing system may contain a remote inductively coupled plasma (ICP) plasma source. An exemplary processing system containing a remote ICP plasma source is depicted in FIG. 13. However, embodiments of the invention are not limited to a remote ICP plasma source as a direct ICP plasma source depicted in FIG. 14 or other plasma sources capable of forming plasma excited $N_2$ species and plasma excited N species are contemplated and may be used.

Figure 4A:
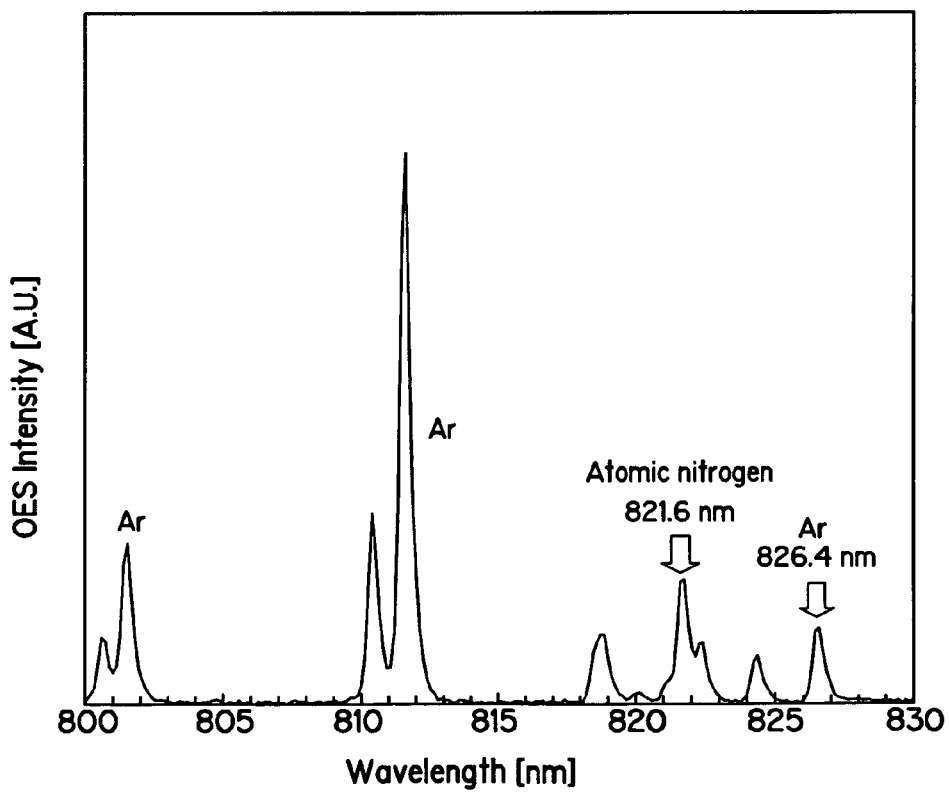
FIGS. 4A and 4B show optical emission intensity as a function of wavelength for a plasma generated by a remote ICP plasma source from a process gas containing $N_2$ and Ar.
Figure 4B:
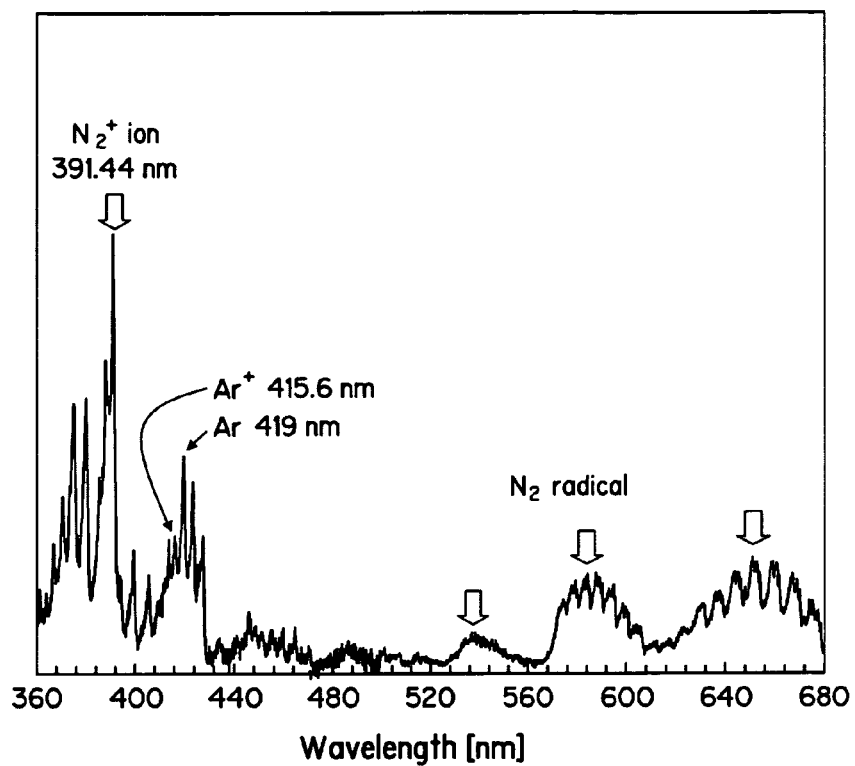

FIGS. 4A and 4B show optical emission intensity as a function of wavelength for a plasma generated by a remote ICP plasma source from a process gas containing $N_2$ and Ar. FIG. 4A shows optical emission from 800 nm to 830 nm and displays features characteristic of plasma excited Ar and plasma excited N radicals at 821.6 nm. FIG. 4B shows optical emission from 360 nm to 680 nm and displays features characteristic of plasma excited $N_2^+$ at a wavelength of 391.44 nm and broad features characteristic of $N_2$ radicals at wavelengths greater than about 520 nm. Although the plasma was generated by a remote ICP plasma source, FIGS. 4A and 4B show that plasma ions ($N_2^+$) are generated and transferred to the process chamber where they are exposed to the substrate before being neutralized.

Figure 4C:
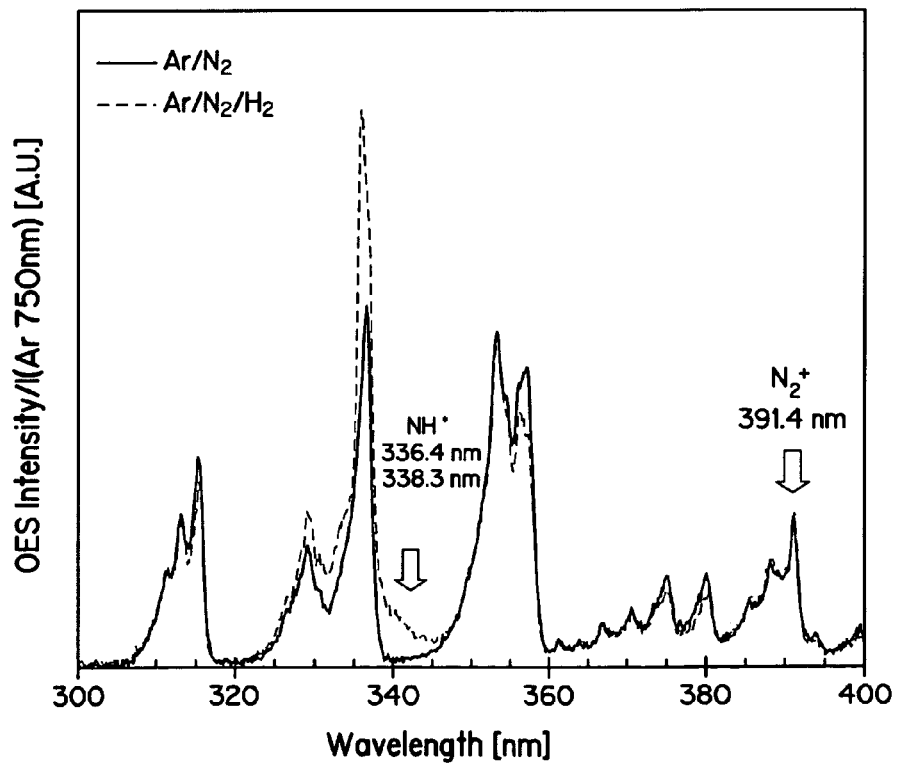
FIGS. 4C and 4D show optical emission as a function of wavelength for plasma generated by an ICP plasma source from a process gas containing $N_2$ and Ar and a process gas containing $N_2$, $H_2$, and Ar.
Figure 4D:
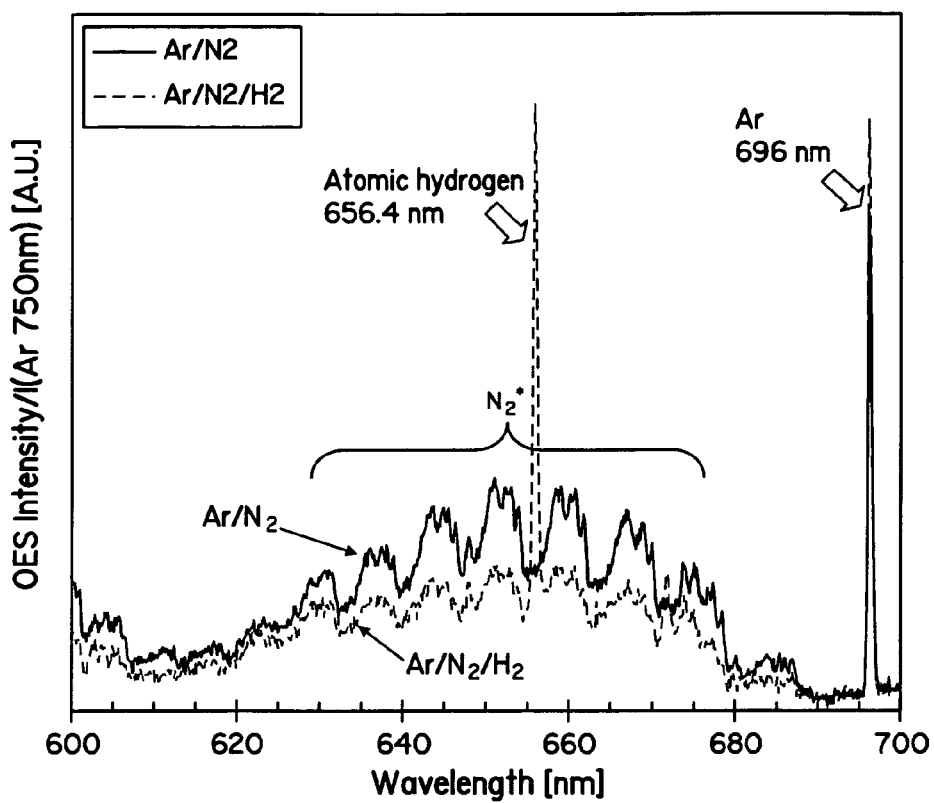

FIGS. 4C and 4D show optical emission as a function of wavelength for plasma generated by a remote ICP plasma source from a process gas containing $N_2$ and Ar and a process gas containing $N_2$, $H_2$, and Ar, respectively. In FIGS. 4C-4D, the spectra were normalized to the Ar emission at 750 nm. FIG. 4C displays a broad emission feature characteristic of plasma excited NH radicals at wavelengths of 336.4 nm and 338.3 nm for the process gas containing $N_2$, $H_2$, and Ar. FIG. 4D displays an emission feature characteristic of plasma excited H radicals at a wavelength of 656.4 nm for a process gas containing $N_2$, $H_2$, and Ar. According to an embodiment of the invention, an ICP plasma source allows for selecting plasma conditions effective to form plasma excited $N_2$ species, including $N_2^+$ and $N_2$ radicals, and plasma excited N species, including N radicals and $NH_x$ radicals (where x=1, 2, or 3), and plasma excited H species, including H radicals.

Figure 5A:
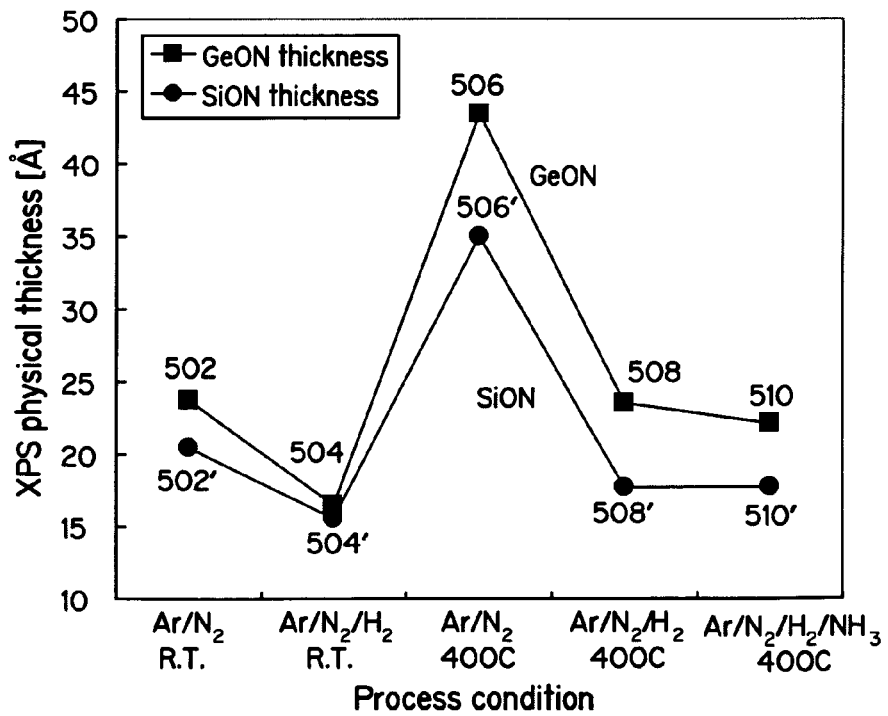
FIGS. 5A and 5B show thickness and nitrogen concentration, respectively, of germanium oxynitride layers and silicon oxynitride layers as a function of process gas composition and process temperature according to embodiments of the invention.
Figure 5B:
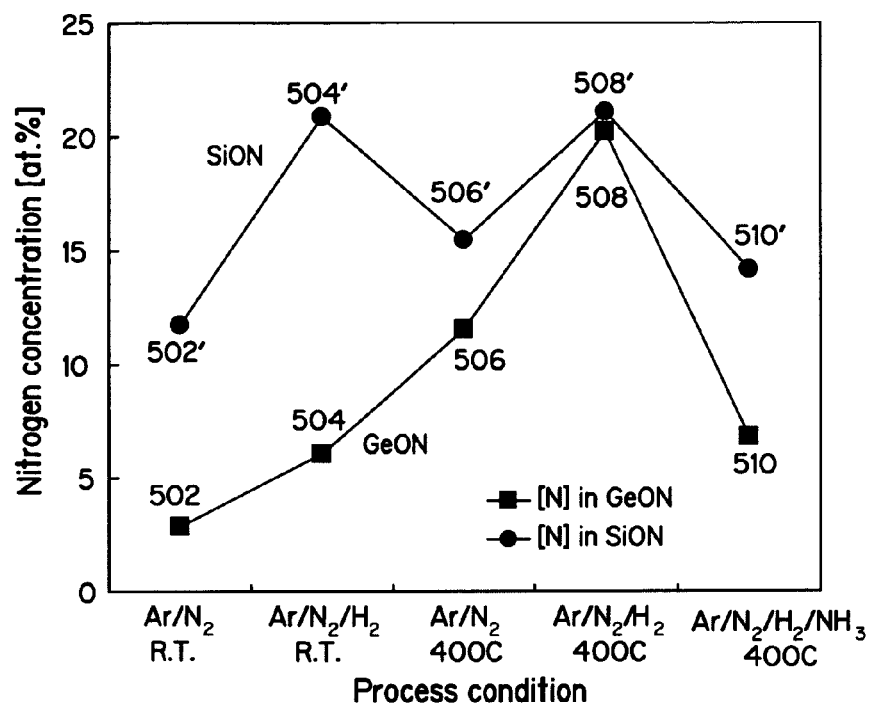

FIGS. 5A and 5B show thickness and nitrogen concentration (atomic percent), respectively, of germanium oxynitride layers and silicon oxynitride layers as a function of process gas composition and process gas temperature according to embodiments of the invention. The as-received Ge(100) and Si(100) substrates where cleaned as described above in reference to FIG. 2. After cleaning, the Ge(100) and Si(100) substrates were plasma processed in a plasma processing system containing the remote ICP plasma source depicted in FIG. 13. The substrates were exposed to the plasma for 30 sec at a process pressure of 1.8 Torr. In FIGS. 5A and 5B, 502-510 refer to germanium oxynitride layers and 502'-510' refer to silicon oxynitride layers, respectively. In particular, layers corresponding to 502 and 502', were formed by exposing the substrates at room. temperature to a process gas containing plasma excited Ar and $N_2$. Layers corresponding to 504 and 504' were formed by exposing a substrate at room temperature to a process gas containing plasma excited Ar, $N_2$, and $H_2$. Layers corresponding to 506 and 506' were formed by exposing a substrate at 400° C. to a process gas containing plasma excited Ar and $N_2$. Layers corresponding to 508 and 508' were formed by exposing a substrate at 400° C. to a process gas containing plasma excited Ar, $N_2$, and $H_2$. Layers corresponding to 510 and 510' were formed by exposing a substrate at 400° C. to a process gas containing plasma excited Ar, $N_2$, $H_2$, and $NH_3$.

The XPS results in FIGS. 5A and 5B show that the germanium oxynitride layers are thicker but have lower nitrogen concentration than the corresponding silicon oxynitride layers. Further, raising the substrate temperature from room temperature to 400° C. increases the layer thickness and the nitrogen concentration, whereas the addition of $H_2$ to the process gas decreases the layer thickness but increases the nitrogen concentration. In particular, raising the substrate temperature and adding $H_2$ forms thin germanium oxynitride layers (<25 angstrom thick) with relatively high nitrogen concentration (~20 atomic percent). In summary, the ICP plasma processing in FIGS. 5A and 5B forms germanium oxynitride films with thicknesses between about 15 angstrom and about 45 angstrom and nitrogen concentration between about 3 atomic percent and about 20 atomic percent.

FIG. 5B shows that the nitrogen concentration in the germanium oxynitride layers can be controlled from about 2 atomic percent to about 20 atomic percent using ICP plasma processing at a process pressure of 1.8 Torr. These results may be compared to the RLSA processing results of FIG. 2 where a similar range of nitrogen concentration was obtained using process pressures at 15 mTorr and 50 mTorr. Thus, ICP plasma processing may be utilized to form germanium oxynitride layers with high nitrogen concentration while utilizing lower priced vacuum systems with higher base pressures. Furthermore, increased process pressures may reduce plasma damage of processed substrates.

Like the oxynitride layers in FIG. 2, the nitrided layers in FIGS. 5A and 5B contained oxygen although an oxygen-containing gas was not added to the process gas. Analogous to FIG. 2, it is contemplated that the oxygen in the germanium oxynitride layers and silicon oxynitride layers in FIG. 5 originated from an oxygen-containing background gas (e.g., $O_2$ or $H_2O$) sputtered from surfaces of the plasma processing system, from oxygen-containing impurities in the process gas, from an oxide layer or adsorbed oxygen-containing species (e.g., $O_2$ or $H_2O$) on the Ge(100) and Si(100) substrates, or from air exposure prior to ex-situ XPS measurements, or a combination thereof.

Figure 6A:
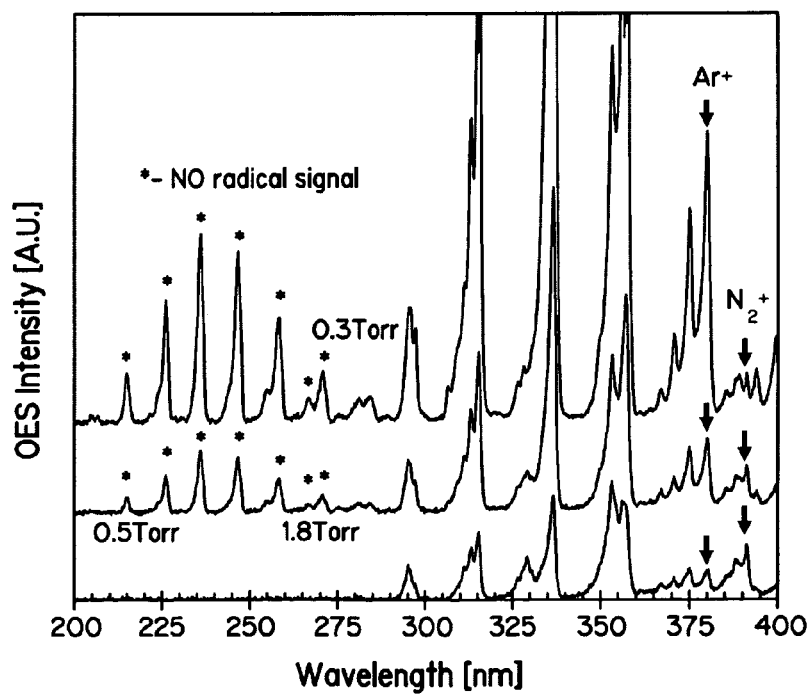
FIGS. 6A-6B show the effect of process pressure on optical emission intensity for a plasma generated by a remote ICP plasma source from a process gas containing $N_2$ and Ar.
Figure 6B:
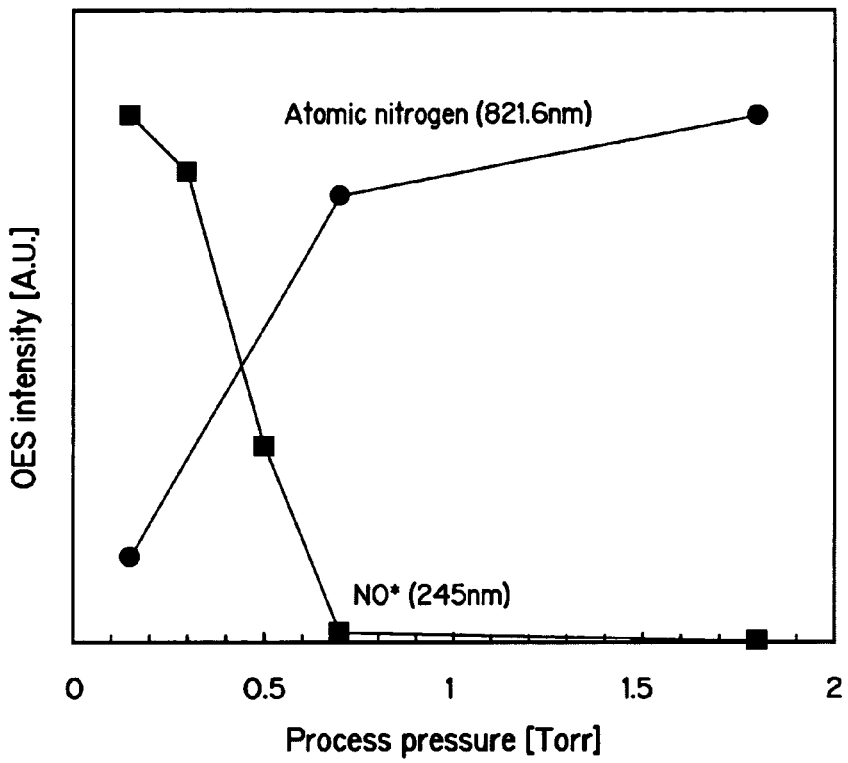

The presence of oxygen species in the process chamber may be seen in FIGS. 6A and 6B. FIGS. 6A-6B show the effect of process pressure on optical emission intensity as a function of wavelength for a plasma generated by a remote ICP plasma source from a process gas containing $N_2$ and Ar. FIG. 6A shows the effect of chamber pressure on optical emission of NO radicals in the plasma. Since NO gas or other oxygen species was not added to the process gas, it is contemplated that the NO may at least partly originate from plasma sputtering of the quartz tube 1306 connecting the ICP plasma source 1302 and the process chamber 1320 depicted in FIG. 13. FIG. 6A shows that optical emission from NO radicals decreases rapidly when the process pressure is increased from 0.3 Torr to 1.8 Torr. FIG. 6B shows the effect of process pressure on optical emission from NO radicals at 245 nm and N radicals at 821.6 nm. Optical emission from NO radicals is not observed at a process pressure above about 0.7 Torr and optical emission from N radicals increases with increasing process pressure. FIG. 6B shows that increasing the process pressure is effective in suppressing the formation of gaseous NO. Increased process pressure reduces plasma ion energy and plasma damage on internal surfaces of the plasma processing system. As described above, it is contemplated that NO impurity gas may at least partly originate from plasma sputtering of the quartz tube 1306, and the amount of the NO impurity gas may be reduced by using corrosion resistant and high melting point materials in the process chamber, thereby reducing the oxidation of the substrates.

Figure 7:
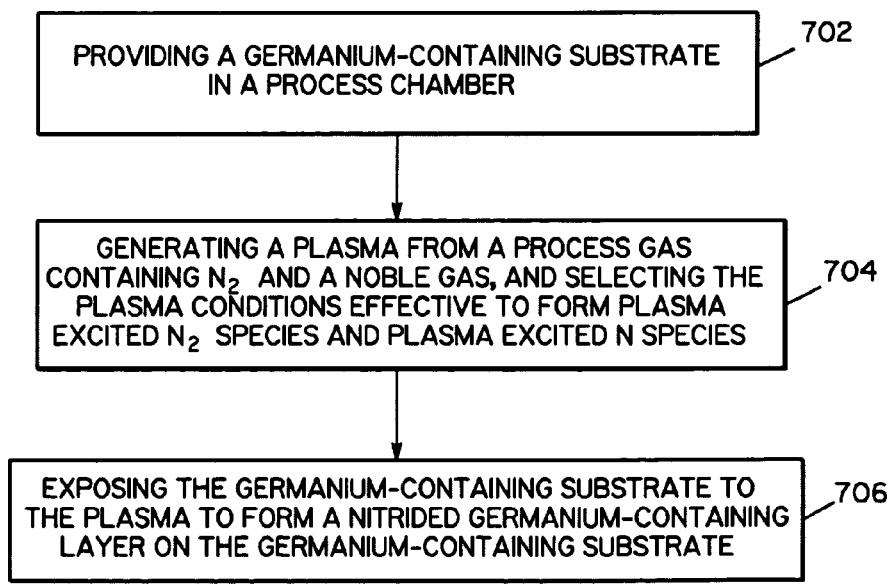
FIG. 7 is a process flow chart for forming a nitrided germanium-containing layer according to an embodiment of the invention.

FIG. 7 is a process flow chart for forming a nitrided germanium-containing layer according to an embodiment of the invention. In step 702, a germanium-containing substrate is provided in a process chamber of a plasma processing system. The plasma processing system can, for example, contain a remote ICP plasma source. The germanium-containing substrate can, for example, be a germanium substrate or a silicon germanium substrate. According to another embodiment of the invention, the germanium-containing substrate may contain an oxide layer or oxygen-containing species adsorbed on a surface of the germanium-containing substrate. According to yet another embodiment of the invention, the germanium-containing substrate may contain a base dielectric layer on the germanium-containing substrate. The base dielectric layer can, for example, contain germanium and oxygen (e.g., GeO or $GeO_2$), or germanium, silicon, and oxygen (GeSiO).

In step 704, a plasma is generated from a process gas containing $N_2$ and a noble gas. The noble gas can, for example, be Ar. According to another embodiment of the invention, the process gas can contain $N_2$, a noble gas, and $H_2$. According to still another embodiment of the invention, the process gas can contain $N_2$, a noble gas, and an oxygen-containing gas. According to yet another embodiment of the invention, the process gas can contain forming gas and a noble gas. The plasma conditions are selected effective to form plasma excited $N_2$ species and plasma excited N species. According to one embodiment of the invention, the plasma excited $N_2$ species comprise $N_2^+$ ions and $N_2$ radicals, and the plasma excited N species comprise N radicals and NHx radicals (where x=1, 2, or 3). Additionally, the plasma may contain plasma excited H species, for example H radicals.

In step 706, the germanium-containing substrate is exposed to the plasma to form a nitrided germanium-containing layer on the germanium containing substrate. The nitrided germanium-containing layer can include a germanium nitride layer, a germanium oxynitride layer, a silicon germanium nitride layer, or a silicon germanium oxynitride layer. According to one embodiment of the invention, the substrate can be maintained at a temperature between room temperature and about 500° C. during the exposing.

As a result of forming both plasma excited $N_2$ and N species, the nitrided germanium-containing layer may contain a higher content of nitrogen species that are soluble in $H_2O$, such as GeN, and a lower content of nitrogen species that are insoluble in $H_2O$, such as $Ge_3N_4$. In addition, for oxynitride layers, the nitrided layer may contain a higher content of oxygen species that are insoluble in $H_2O$, such as GeO, and a lower content of oxygen species that are soluble in $H_2O$, such as $GeO_2$. Consequently, subsequent processing with $H_2O$ may be used to remove the soluble species, if desired, or $H_2O$ processing may be avoided if it is not desirable to remove the soluble species.

Figure 8A:
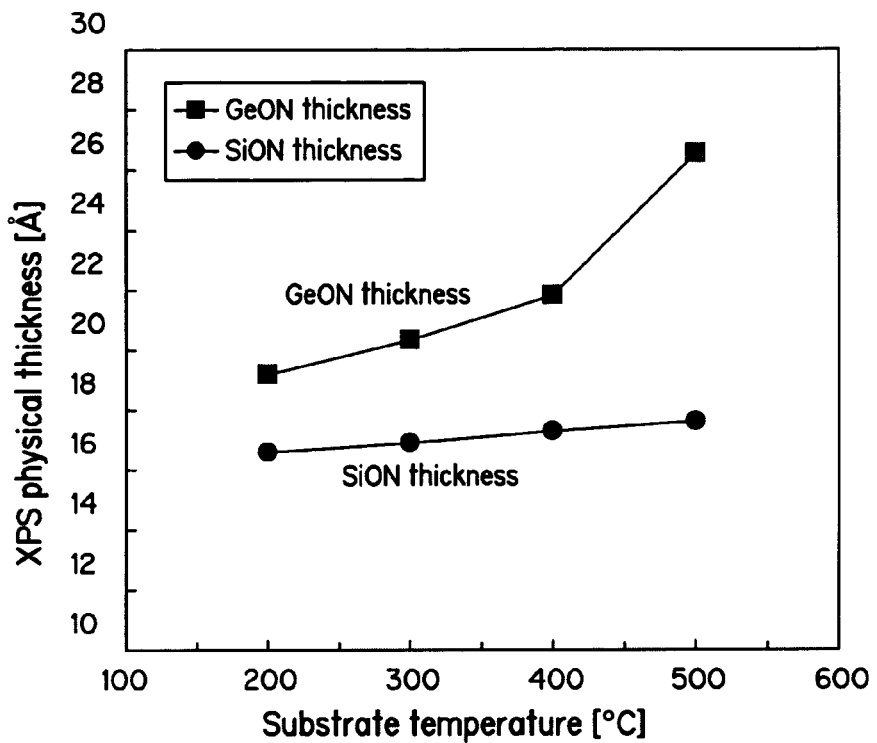
FIGS. 8A and 8B show thickness and nitrogen concentration, respectively, of germanium oxynitride layers and silicon oxynitride layers as a function of substrate temperature.
Figure 8B:
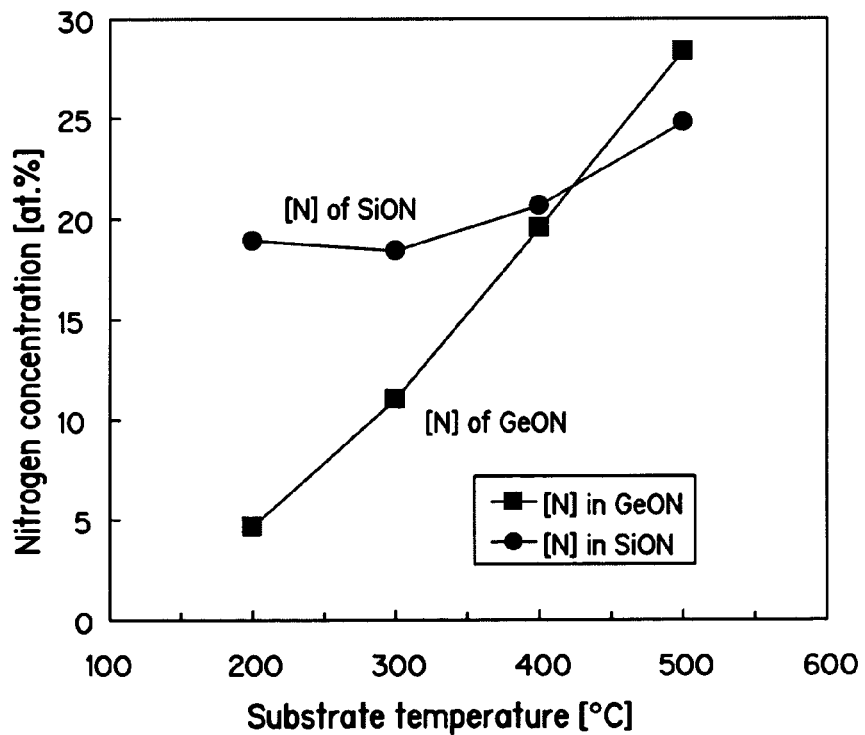
Figure 8C:
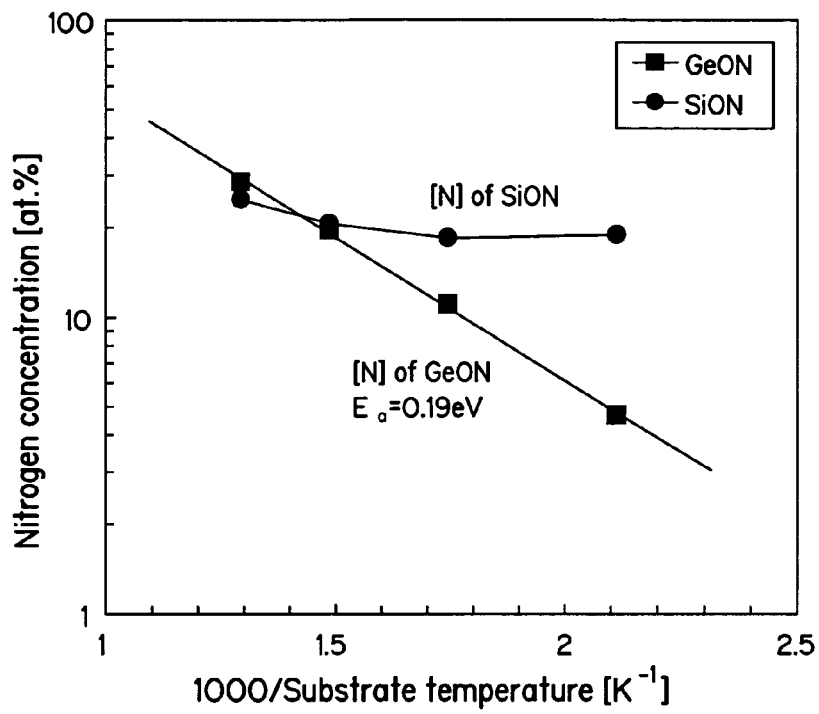
FIG. 8C shows an Arrhenius plot of the data in FIG. 8B.

FIGS. 8A and 8B show thickness and nitrogen concentration, respectively, of germanium oxynitride layers and silicon oxynitride layers as a function of substrate temperature. The plasma was generated by a remote ICP plasma source from a process gas containing $N_2$, $H_2$, and Ar. The thickness and nitrogen concentration of the germanium oxynitride layers shows greater temperature dependence than silicon oxynitride layers, indicating that the germanium oxynitride layers have higher activation energy for nitridation than silicon oxynitride layers. FIG. 8C shows an Arrhenius plot of the data from FIG. 8B. Nitrogen concentration of the germanium oxynitride layers shows strong dependence of substrate temperature and has an apparent activation energy of 0.19 eV±0.1 eV, whereas the nitrogen concentration of silicon oxynitride layers shows little dependence on substrate temperature. It has been reported that during thermal $NH_3$ nitridation of germanium and silicon substrates, hydrogen atoms may serve as a catalyst to form stable H—Ge—NH—Ge—H or H—Si—NH—Si—H bridge structures, where germanium requires a higher activation energy for nitridation than silicon. Therefore, it is contemplated that plasma excited H species may act as a catalyst for enhancing formation of Ge—N or Si—N, and that this H catalyzed chemical reaction may be controlled by varying the substrate temperature. In summary, FIGS. 8A-8C show that the thickness and nitrogen concentration of germanium oxynitride layers can be controlled by varying the substrate temperature. In particular, increased nitrogen-concentration is obtained at higher substrate temperatures.

Figure 9A:
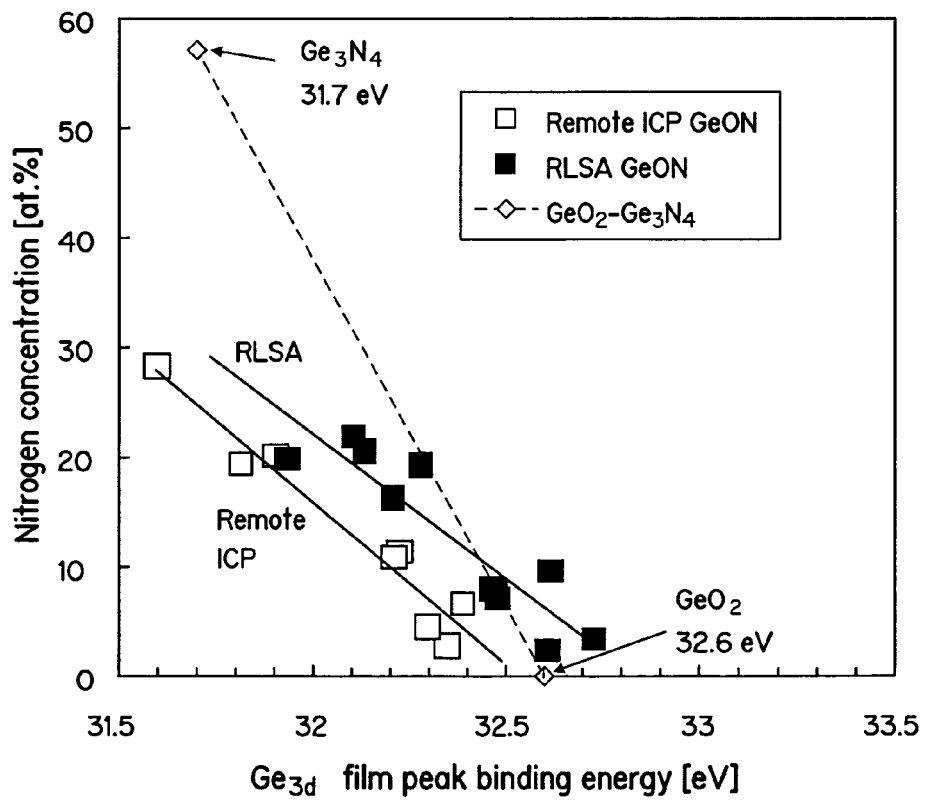
FIGS. 9A and 9B show nitrogen concentration as a function of $Ge_{3d}$ binding energy and $Si_{2p}$ binding energy, respectively, for RLSA and ICP processed germanium-containing substrates and silicon-containing substrates.
Figure 9B:
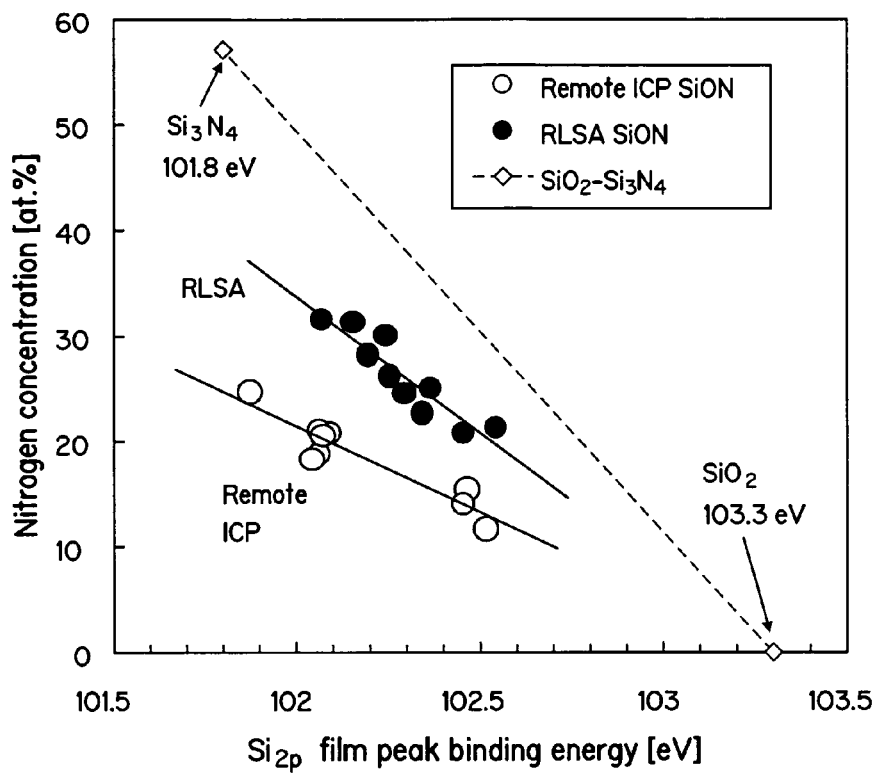

FIGS. 9A and 9B show nitrogen concentration as a function of $Ge_{3d}$ binding energy and $Si_{2p}$ binding energy, respectively, for RLSA and ICP processed germanium-containing substrates and silicon-containing substrates. The germanium oxynitride layers and silicon oxynitride layers formed by RLSA processing have higher $Ge_{3d}$ and $Si_{2p}$ binding energies than layers with the same nitrogen concentration formed by ICP processing. Furthermore, the $Ge_{3d}$ and $Si_{2p}$ binding energies are reduced with increasing nitrogen concentration. Known $Ge_{3d}$ and $Si_{2p}$ binding energies for $Ge_3N_4$, $Si_3N_4$, $GeO_2$, and $SiO_2$ layers are shown for comparison. The $Ge_{3d}$, $Si_{2p}$ binding energies for $Ge_3N_4$, $Si_3N_4$ are lower than for $GeO_2$, $SiO_2$, due to lower electron binding energies in $Ge^{3+}{}_{3d}$, $Si^{3+}{}_{2p}$ than in $Ge^{4+}{}_{3d}$, $Si^{4+}{}_{2p}$, respectively. These differences in electron binding energies can be used to determine whether oxygen or nitrogen is preferentially removed during etching of germanium oxynitride layers and the type of chemical bonding environment present (e.g., GeO, $GeO_2$, GeON) in the layers.

Figure 10A:
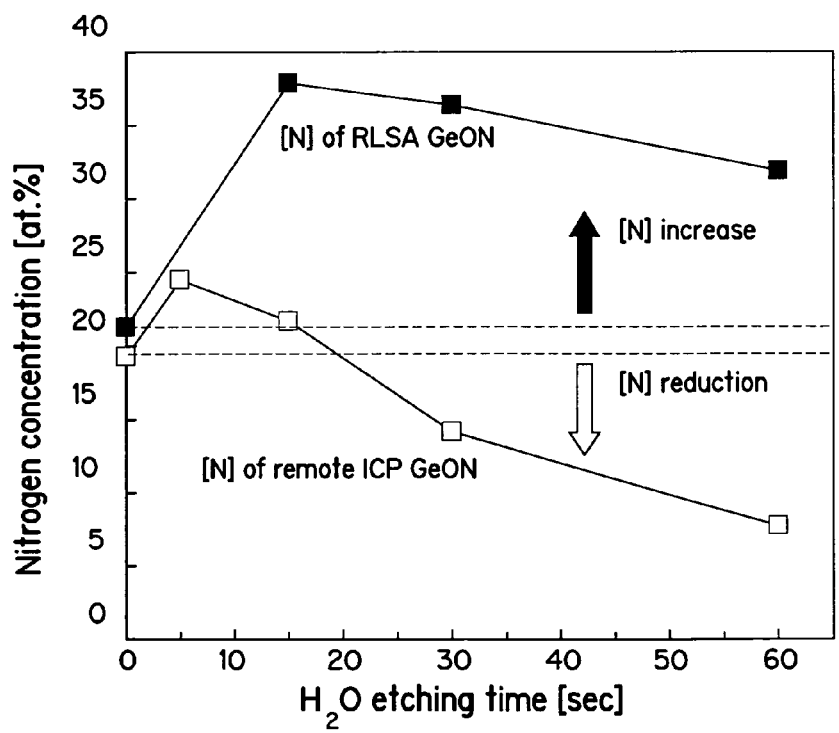
FIGS. 10A, 10B, and 10C show nitrogen concentration, $Ge_{3d}$ binding energy of germanium oxynitride layers and thickness of germanium oxynitride layers, respectively, as a function of $H_2O$ etching time according to an embodiment of the invention.
Figure 10B:
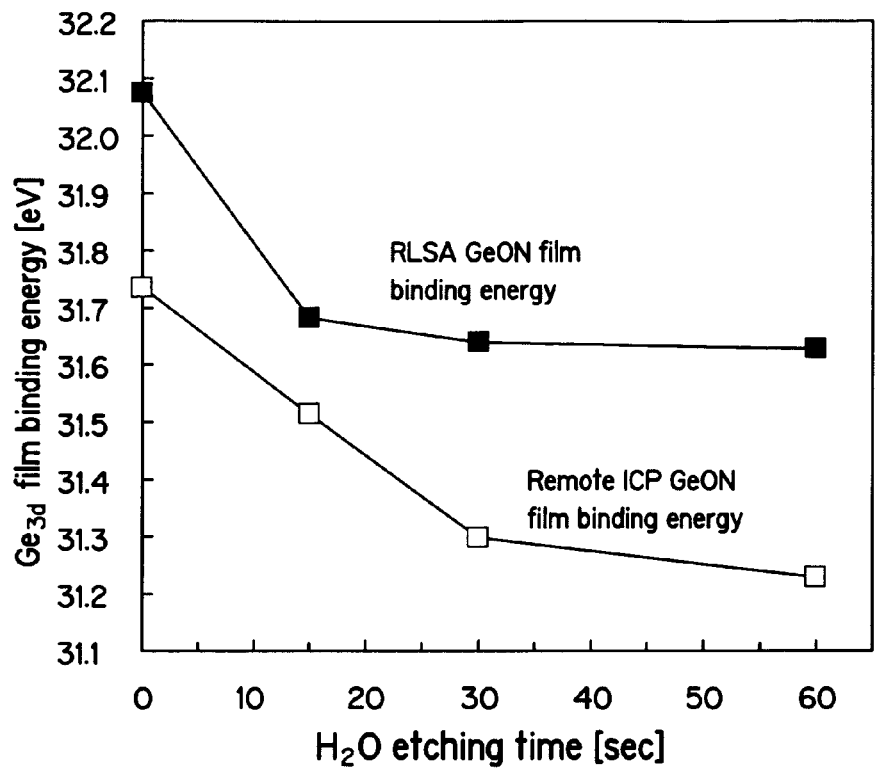
Figure 10C:
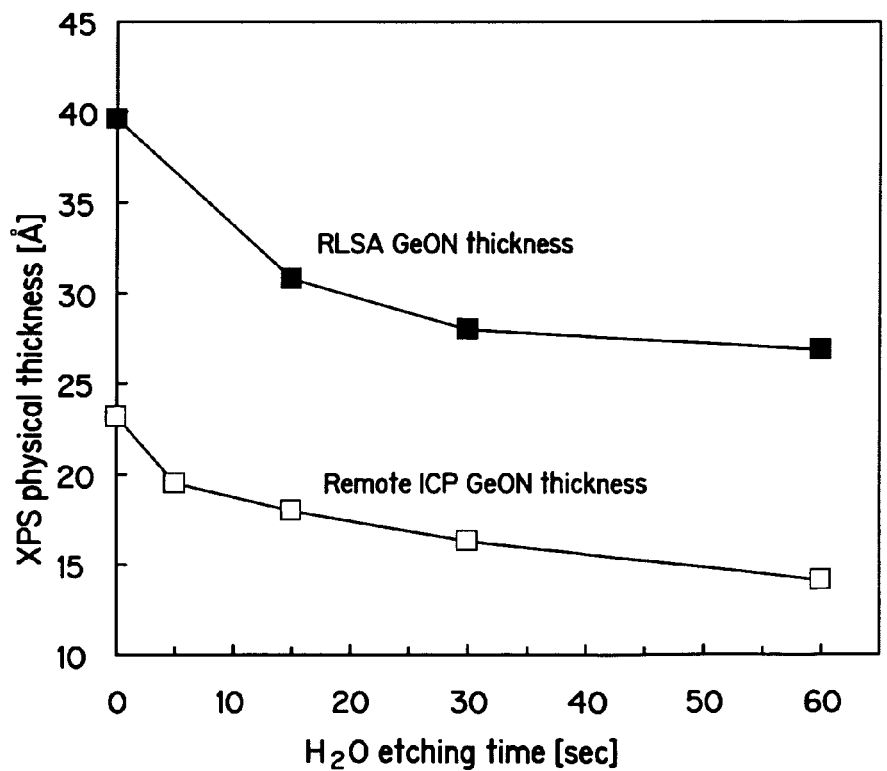

FIGS. 10A and 10B show nitrogen concentration and $Ge_{3d}$ binding energy, respectively, of germanium oxynitride layers as a function of $H_2O$ etching time according to an embodiment of the invention. The germanium oxynitride layers were formed by RLSA processing and remote ICP processing. The RLSA processing conditions included maintaining the substrate at room temperature, a process pressure of 15 mTorr, a process gas containing $N_2$ and Ar, and a 2 min plasma exposure time. The remote ICP processing conditions included maintaining the substrate at 400° C., a process pressure of 1.8 Torr, a process gas containing $N_2$ and Ar, and a 2 min plasma exposure time. Thereafter, the germanium oxynitride layers were etched in liquid $H_2O$ for a desired time period and subsequently dried with dry $N_2$ flow. FIG. 10A shows that $H_2O$ etching of the RLSA processed layers increased the nitrogen concentration of the layers, but $H_2O$ etching of the ICP processed layers reduced the nitrogen concentration of the layers. FIG. 10B shows that the peak $Ge_{3d}$ binding energy of the RLSA and ICP processed layers is reduced by the etching process. FIG. 10C shows thickness of germanium oxynitride layers as a function of $H_2O$ etching time. The thickness of both ICP and RLSA processed germanium oxynitride layers is reduced during $H_2O$ etching. The results in FIGS. 10A-10C, along with FIG. 9A, show that the low $Ge_{3d}$ binding energy of ICP processed layers is not directly related to the nitrogen concentration in the ICP processed layers, since the reduction in $Ge_{3d}$ binding energy shown in FIG. 10B is not a result of increased nitrogen concentration, but rather is a result of removal of nitrogen species that are soluble in $H_2O$ from the ICP processed layers. Thus, the ICP processed layers may be referred to as containing nitrogen species soluble in $H_2O$ and oxygen species insoluble in $H_2O$. Similarly, the RLSA processed layers contain nitrogen species insoluble in $H_2O$ and oxygen species soluble in $H_2O$. As further described below in reference to FIG. 11B, the oxygen species soluble in $H_2O$ may be $GeO_2$ and the oxygen species insoluble in $H_2O$ may be GeO. It has been reported that GeO is insoluble in $H_2O$ and retains $Ge^{3+}{}_{3d}$ bonding which results in lower binding energy. Furthermore, the nitrogen species insoluble in $H_2O$ may be $Ge_3N_4$ and the nitrogen species soluble in $H_2O$ may be GeN. In general, the etching process can utilize a liquid or gas comprising hydrogen and oxygen, including $H_2O$ or $H_2O_2$.

Figure 11A:
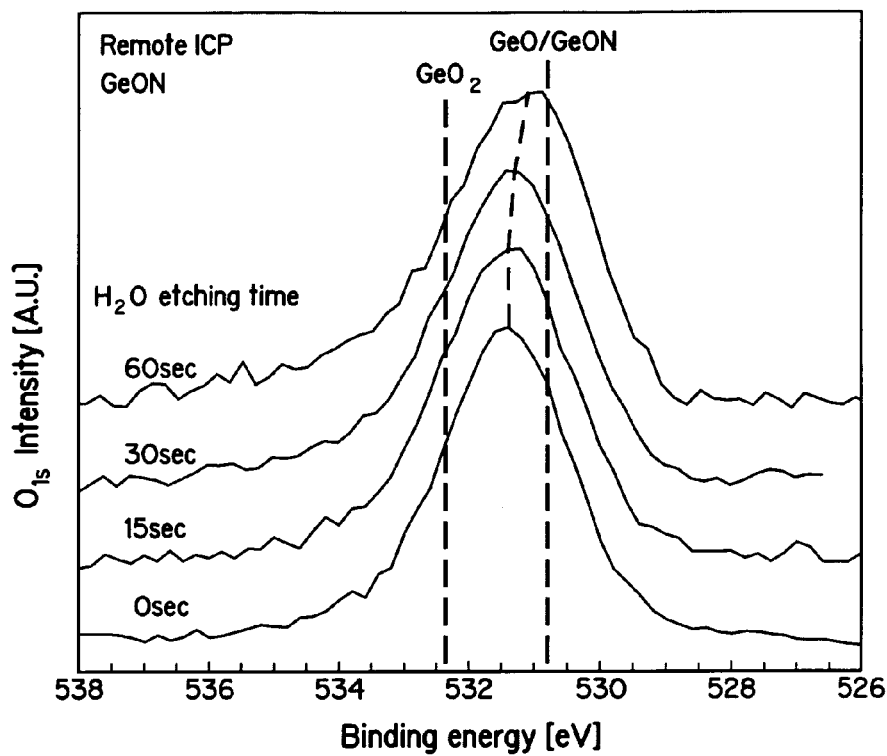
FIGS. 11A and 11B show XPS $O_{1s}$ intensity of germanium oxynitride layers as a function of binding energy.
Figure 11B:
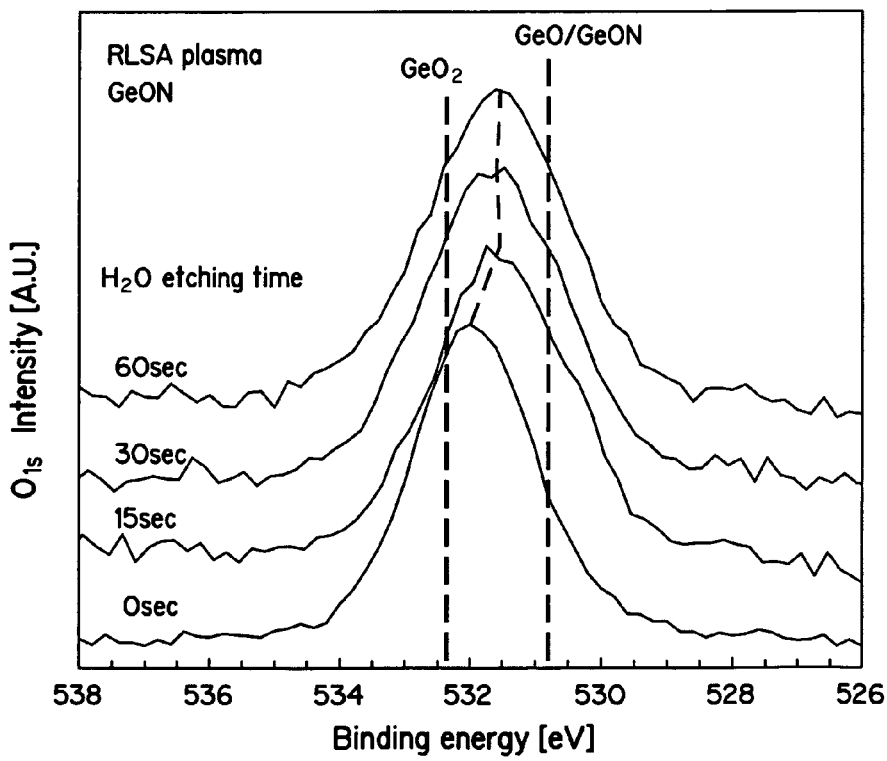

FIGS. 11A and 11B show XPS $O_{1s}$ intensity as a function of electron binding energy and $H_2O$ etching time. The germanium oxynitride layers were prepared and etched as described in reference to FIG. 10. FIG. 11A shows the results for remote ICP processed germanium oxynitride layers and FIG. 11B shows the results for RLSA processed germanium oxynitride layers. Handbook values for the $O_{1s}$ binding energies of $GeO_2$ and GeO/GeON layers are shown for reference. Comparison of the traces in FIGS. 11A and 11B shows that the as-deposited RLSA processed layers contain a greater amount of $GeO_2$ than the ICP processed layers. It is contemplated that the low $Ge_{3d}$ binding energy of the unetched germanium oxynitride layer in FIG. 11A originates from GeO species in the ICP processed layer. FIG. 11B shows that the $GeO_2$ species are effectively removed during $H_2O$ etching of RLSA processed layers as the peak intensities shift to lower electron binding energies.

FIG. 12 is a simplified block-diagram of a plasma processing system containing a RLSA plasma source according to an embodiment of the invention. A RLSA plasma source is also referred to as a slot plane antenna (SPA) plasma source. The plasma produced in the plasma processing system 400 is characterized by low electron temperature (less than about 1.5 eV) and high plasma density ($>1 \times 10^{12}/cm^3$), which enables damage-free processing of substrates. The plasma processing system 400 can, for example, be a TRIAS™ SPA processing system from Tokyo Electron Limited, Akasaka, Japan. The plasma processing system 400 contains a process chamber 450 having an opening portion 451 in the upper portion of the process chamber 450 that is larger than a substrate 458. A cylindrical dielectric top plate 454 made of quartz or aluminum nitride is provided to cover the opening portion 451. Gas lines 472 are located in the side wall of the upper portion of process chamber 450 below the top plate 454. In one example, the number of gas lines 472 can be 16 (only two are which are shown in FIG. 12). Alternately, a different number of gas lines 472 can be used. The gas lines 472 can be circumferentially arranged in the process chamber 450, but this is not required for the invention. A process gas can be evenly and uniformly supplied into the plasma region 459 in process chamber 450 from the gas lines 472.

In the plasma processing system 400, microwave power is provided to the process chamber 450 through the top plate 454 via a slot plane antenna member 460 having a plurality of slots 460A. The slot plane antenna member 460 can be made from a metal plate, for example copper. In order to supply the microwave power to the slot plane antenna member 460, a waveguide 463 is disposed on the top plate 454, where the waveguide 463 is connected to a microwave power supply 461 for generating microwaves with a frequency of 2.45 GHz, for example. The waveguide 463 contains a flat circular waveguide 463A with a lower end connected to the slot plane antenna member 460, a circular waveguide 463B connected to the upper surface side of the circular waveguide 463A, and a coaxial waveguide converter 463C connected to the upper surface side of the circular waveguide 463B. Furthermore, a rectangular waveguide 463D is connected to the side surface of the coaxial waveguide converter 463C and the microwave power supply 461.

Inside the circular waveguide 463B, an axial portion 462 of an electroconductive material is coaxially provided, so that one end of the axial portion 462 is connected to the central (or nearly central) portion of the upper surface of slot plane antenna member 460, and the other end of the axial portion 462 is connected to the upper surface of the circular waveguide 463B, thereby forming a coaxial structure. As a result, the circular waveguide 463B is constituted so as to function as a coaxial waveguide. The microwave power can, for example, be between about 0.5 W/cm$^2$ and about 4 W/cm$^2$. Alternately, the microwave power can be between about 0.5 W/cm$^2$ and about 3 W/cm$^2$.

In addition, in the process chamber 450, a substrate holder 452 is provided opposite the top plate 454 for supporting and heating a substrate 458 (e.g., a wafer). The substrate holder 452 contains a heater 457 to heat the substrate 458, where the heater 457 can be a resistive heater. Alternately, the heater 457 may be a lamp heater or any other type of heater. Furthermore the process chamber 450 contains an exhaust line 453 connected to the bottom portion of the process chamber 450 and to a vacuum pump 455.

Still referring to FIG. 12, a controller 499 includes a microprocessor, a memory, and a digital I/O port capable of generating control voltages sufficient to communicate and activate inputs of the plasma processing system 400 as well as monitor outputs from the plasma processing system 400. Moreover, the controller 499 is coupled to and exchanges information with process chamber 450, the pump 455, the heater 457, and the microwave power supply 461. A program stored in the memory is utilized to control the aforementioned components of plasma processing system 400 according to a stored process recipe. One example of processing system controller 499 is a UNIX-based workstation. Alternately, the controller 499 can be implemented as a general-purpose computer, digital signal processing system, etc.

The controller 499 may be locally located relative to the plasma processing system 400 or it may be remotely located relative to the plasma processing system 400 via an internet or intranet. Thus, the controller 499 can exchange data with the plasma processing system 400 using at least one of a direct connection, an intranet, or the internet. The controller 499 may be coupled to an intranet at a customer site (i.e., a device maker, etc.), or coupled to an intranet at a vendor site (i.e., an equipment manufacturer). Furthermore, another computer (i.e., controller, server, etc.) can access the controller 499 to exchange data via at least one of a direct connection, an intranet, or the internet.

Further details of a plasma processing system containing a slot plane antenna plasma source and methods of using are described in copending European Patent Application EP1361605A1, titled "METHOD FOR PRODUCING MATERIAL OF ELECTRONIC DEVICE", the entire content of which is hereby incorporated by reference.

FIG. 13 is a simplified block-diagram of a plasma processing system containing a remote ICP plasma source according to an embodiment of the invention. The exemplary plasma processing system 1300 contains a LITMAS™ 1501 ICP plasma source 1302 from Advanced Energy, Fort Collins, Colo., with a 2.4 MHz RF plasma generator 1304. Plasma is generated by the plasma source 1302 from a process gas flowed from a first gas source 1308 and first mass flow controller 1310 and the plasma is transmitted to a process chamber 1320 and onto a substrate 1322 via a 30 mm diameter quartz tube 1306. The plasma processing system further includes a second gas source 1312, a second mass flow controller 1314, and a gas line 1316 for introducing unexcited gases directly into the process chamber 1320. The gases sources 1308 and 1312 can, for example, supply $N_2$, $NH_3$, $H_2$, and Ar gases. The $N_2$, $NH_3$, $H_2$ gases were purified by a gas purifier from Pall Corporation Limited, East Hills, N.Y., to reduce oxygen contamination in these gases. The Ar gas was 99.999% pure and used as received. In FIG. 13, the process chamber 1320 further contains a quartz viewport 1324 for transmitting optical emission from the plasma to an optical detection system 1332, a substrate holder 1326, a substrate heater 1328, and a pumped exhaust 1330 for exhausting the process gas from the process chamber 1320.

Although not shown, the plasma processing system 1300 further includes valves, control electronics, and utility hookups which are typical of plasma processing systems. A controller 1340 is coupled to and exchanges information with multiple components of the plasma processing system 1300, including the plasma source 1302, the process chamber 1320, and the optical monitoring system 1332. In addition, the controller 1340 is coupled to and exchanges information with valves, pumps, pressure gauges, heaters, and temperature gauges of the plasma processing system 1300. The controller 1340 is capable of generating control signals sufficient to communicate and control the inputs of the film plasma processing system 1300 as well as monitor the outputs from the plasma processing system 1300.

Figure 14:
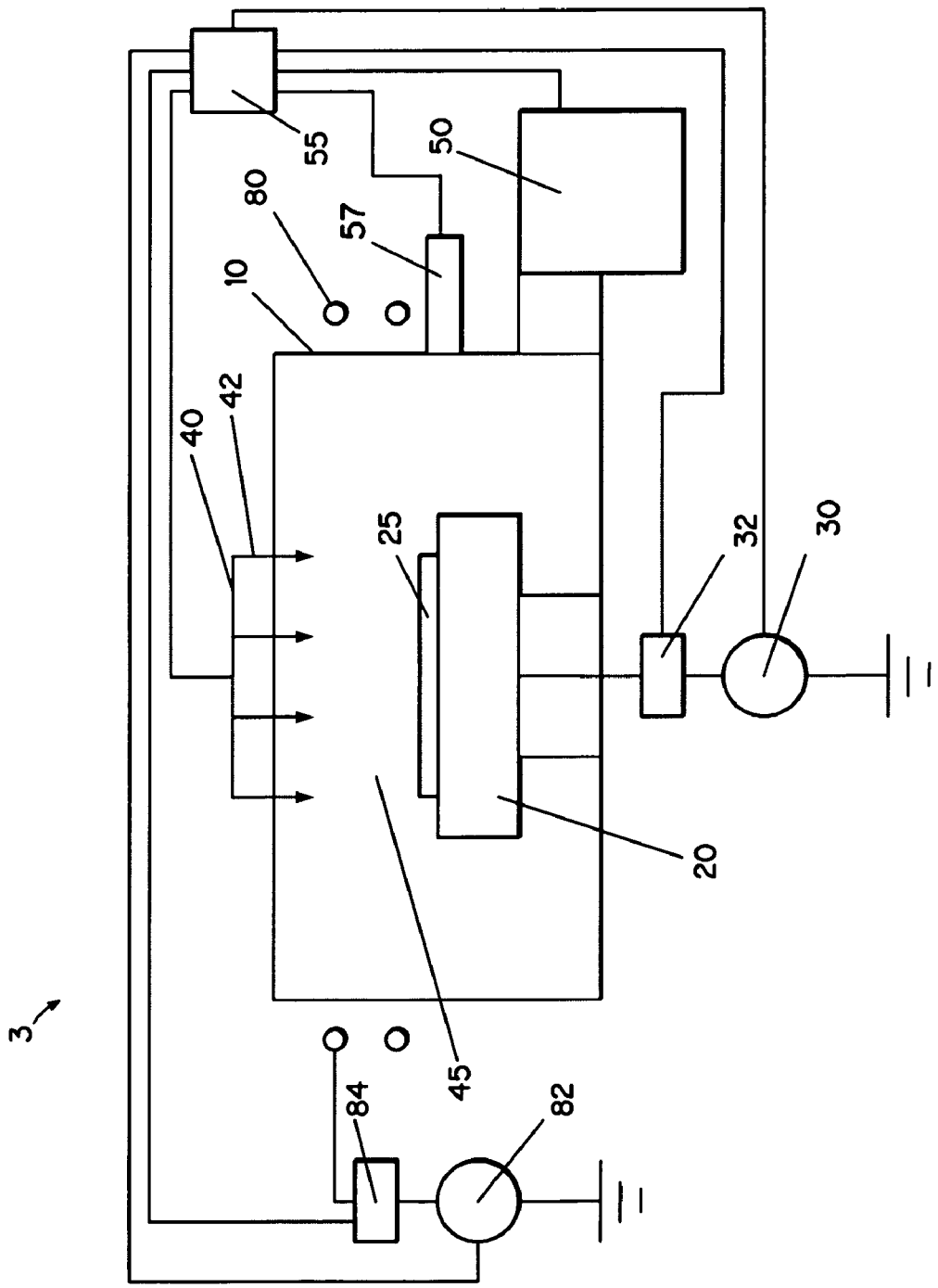
FIG. 14 is a simplified block-diagram of a plasma processing system containing an ICP plasma source according to an embodiment of the invention.

FIG. 14 is a simplified block-diagram of a plasma processing system containing an ICP plasma source according to an embodiment of the invention. The plasma processing system 3 is configured to facilitate the generation of plasma in processing region 45 of the process chamber 10. The plasma processing system 3 further comprises a substrate holder 20, upon which a substrate 25 to be processed is affixed and makes electrical contact to, and a gas injection system 40 for introducing process gas 42 to the process chamber 10, and a vacuum pumping system 50. The gas injection system 40 allows independent control over the delivery of the process gas 42 to the process chamber 10 from ex-situ gas sources.

An ionizable process gas 42 is introduced via the gas injection system 40 and the process pressure is adjusted. The flow rate of the process gas can be between about 10 sccm and about 5000 sccm, alternately between about 20 sccm and about 1000 sccm, and still alternately between about 50 sccm and about 500 sccm. The chamber pressure can, for example, be between about 1 mTorr and about 10 Torr, alternately between about 5 mTorr and about 200 mTorr, and still alternately between about 10 mTorr and about 50 mTorr. The controller 55 can be used to control the vacuum pumping system 50 and gas injection system 40. Substrate 25 is transferred into process chamber 10 through a slot valve (not shown) and chamber feed-through (not shown) via a (robotic) substrate transfer system where it is received by substrate lift pins (not shown) housed within substrate holder 20 and mechanically translated by devices housed therein. Once the substrate 25 is received from the substrate transfer system, it is lowered to an upper surface of the substrate holder 20.

In an alternate embodiment, the substrate 25 is affixed to the substrate holder 20 via an electrostatic clamp (not shown). Furthermore, the substrate holder 20 further includes a cooling system including a re-circulating coolant flow that receives heat from the substrate holder 20 and transfers heat to a heat exchanger system (not shown), or when heating, transfers heat from the heat exchanger system. Moreover, gas may be delivered to the backside of the substrate to improve the gas-gap thermal conductance between the substrate 25 and the substrate holder 20. Such a system is utilized when temperature control of the substrate is required at elevated or reduced temperatures. For example, temperature control of the substrate may be useful at temperatures in excess of the steady-state temperature achieved due to a balance of the heat flux delivered to the substrate 25 from the plasma and the heat flux removed from substrate 25 by conduction to the substrate holder 20. In other embodiments, heating elements, such as resistive heating elements, or thermo-electric heaters/coolers are included in the substrate holder 20.

With continuing reference to FIG. 14, the process gas 42 is introduced to the processing region 45 through the gas injection system 40. Gas injection system 40 can include a showerhead, wherein the process gas 42 is supplied from a gas delivery system (not shown) to the processing region 45 through a gas injection plenum (not shown), a series of baffle plates (not shown) and a multi-orifice showerhead gas injection plate.

Vacuum pump system 50 can include a turbo-molecular vacuum pump (TMP) capable of a pumping speed up to 5000 liters per second (and greater), and a gate valve for throttling the chamber pressure. In conventional plasma processing devices utilized for plasma nitridation, a 1000 to 3000 liter per second TMP is employed. TMPs are useful for low pressure processing, typically less than 50 mTorr. For high pressure processing (i.e. greater than 100 mTorr), a mechanical booster pump and dry roughing pump are used.

A controller 55 includes a microprocessor, a memory, and a digital I/O port capable of generating control voltages sufficient to communicate and activate inputs to the plasma processing system 3 as well as monitor outputs from the plasma processing system 3. Moreover, the controller 55 is coupled to and exchanges information with the RF generator 30, the impedance match network 32, the RF generator 82, the impedance match network 84, the gas injection system 40, plasma monitor system 57, and the vacuum pump system 50. A program stored in the memory is utilized to control the aforementioned components of a plasma processing system 3 according to a stored process recipe. One example of controller 55 is a digital signal processor (DSP); model number TMS320, available from Texas Instruments, Dallas, Tex.

The plasma monitor system 57 can comprise, for example, an optical emission spectroscopy (OES) system to measure excited particles in the plasma environment and/or a plasma diagnostic system, such as a Langmuir probe, for measuring plasma density. The plasma monitor system 57 can be used with controller 55 to determine the status of the plasma process and provide feedback to ensure process compliance. Alternately, plasma monitor system 57 can comprise a microwave and/or a RF diagnostic system.

The plasma processing system 3 further includes a RF plasma source comprising an inductive coil 80 to which RF power is coupled via the RF generator 82 through the impedance match network 84. RF power is inductively coupled from the inductive coil 80 through a dielectric window (not shown) to the plasma-processing region 45. A typical frequency for the application of RF power to the inductive coil 80 ranges from 0.1 MHz to 100 MHz and can be 13.56 MHz. The RF power applied to the inductive coil 80 can be between about 50 W and about 10000 W. Similarly, a typical frequency for the application of power to the substrate holder 20 (chuck electrode) ranges from 0.1 MHz to 30 MHz and can be 13.56 MHz. The RF power applied to the substrate holder 20 can be between about 0 W and about 1000 W. In addition, a slotted Faraday shield (not shown) can be employed to reduce capacitive coupling between the inductive coil 80 and plasma. Moreover, the controller 55 is coupled to the RF generator 82 and the impedance match network 84 in order to control the application of power to the inductive coil 80.

It should be understood that various modifications and variations of the present invention may be employed in practicing the. invention. It is therefore to be understood that, within the scope of the appended claims, the invention may be practiced otherwise than as specifically described herein.

What is claimed is:

1. A method for forming a dielectric layer of a semiconductor device, the method comprising:
   providing a germanium-containing substrate in a process chamber;
   generating a plasma from a process gas containing $N_2$ and a noble gas, and selecting the plasma conditions effective to form plasma excited $N_2$ species and N species, wherein the plasma excited $N_2$ species comprise $N_2^+$ ions and $N_2$ radicals, and the plasma excited N species comprise N radicals; and
   exposing the germanium-containing substrate to the plasma to form a nitrided germanium-containing layer on the germanium-containing substrate, wherein the nitrided germanium-containing layer comprises a germanium oxynitride layer containing nitrogen species soluble in $H_2O$ and oxygen species insoluble in $H_2O$.

2. The method according to claim 1, wherein the process gas further comprises the plasma excited N species further comprise $NH_x$ radicals.

3. The method according to claim 1, wherein the process gas comprises $N_2$, a noble gas, $H_2$, and $NH_3$.

4. The method according to claim 1, further comprising: maintaining the substrate at a temperature between room temperature and about 500° C. during the exposing.

5. The method according to claim 1, wherein the germanium-containing substrate is germanium, or germanium and silicon.

6. The method according to claim 5, wherein the germanium-containing substrate further comprises a base dielectric layer containing oxygen overlying the germanium-containing substrate and the exposing comprises exposing the base dielectric layer to the plasma to form a nitrided base dielectric layer.

7. The method according to claim 1, wherein the process gas further comprises an oxygen-containing gas.

8. The method according to claim 1, wherein the process gas further comprises an oxygen-containing background gas.

9. The method according to claim 1, wherein the germanium-containing substrate comprises an oxide layer or an adsorbed oxygen-containing species.

10. The method according to claim 1, wherein the generating further comprises:
    monitoring light emission from the excited species in the plasma by optical emission spectroscopy, wherein the excited species comprise $N_2^+$ ions, $N_2$ radicals, and N radicals; and
    adjusting the plasma conditions based on the monitoring.

11. The method according to claim 1, wherein the plasma is generated by an inductively coupled plasma source.

12. The method according to claim 1, further comprising:
    exposing the germanium oxynitride layer to liquid $H_2O$ or gaseous $H_2O$ to reduce the thickness and the nitrogen-concentration of the germanium oxynitride layer by removing at least a portion of the nitrogen species soluble in $H_2O$.

13. The method according to claim 1, wherein the generating comprises:
    generating a plasma from a process gas containing $N_2$, $H_2$, and a noble gas, and selecting the plasma conditions effective to form plasma excited $N_2$ species, plasma excited N species, and plasma excited H species; and
    exposing the germanium-containing substrate to the plasma to form a nitrided germanium-containing layer on the germanium-containing substrate, wherein the activation energy of forming the nitrided germanium-containing layer is 0.19 eV±0.1 eV.

14. The method according to claim 13, wherein the plasma excited $N_2$ species comprise $N_2^+$ ions and $N_2$ radicals, the plasma excited N species comprise N radicals and the $NH_x$ radicals, and the plasma excited H species comprise H radicals.

15. A method for forming a dielectric layer of a semiconductor device, the method comprising:

providing a germanium-containing substrate in a process chamber;

generating a plasma from a process gas containing $N_2$ and a noble gas, and selecting the plasma conditions effective to form plasma excited $N_2$ species and N species, wherein the plasma excited $N_2$ species comprise $N_2^+$ ions and $N_2$ radicals, and the plasma excited N species comprise N radicals; and exposing the germanium-containing substrate to the plasma to form a germanium oxynitride layer on the germanium-containing substrate, wherein the germanium oxynitride layer contains a greater amount of nitrogen species soluble in $H_2O$ than nitrogen species insoluble in $H_2O$ and a greater amount of oxygen species insoluble in $H_2O$ than oxygen species soluble in $H_2O$, and wherein the nitrogen species insoluble in $H_2O$ include $Ge_3N_4$, the oxygen species soluble in $H_2O$ include $GeO_2$, the nitrogen species soluble in $H_2O$ include GeN, and the oxygen species insoluble in $H_2O$ include GeO.

16. The method according to claim 15, wherein the plasma is generated by an inductively coupled plasma source.

17. A method for forming a dielectric layer of a semiconductor device, the method comprising:

providing a germanium-containing dielectric layer containing a greater amount of nitrogen species soluble in $H_2O$ than nitrogen species insoluble in $H_2O$ and a greater amount of oxygen species insoluble in $H_2O$ than oxygen species soluble in $H_2O$; and exposing the germanium-containing dielectric layer to liquid $H_2O$ or gaseous $H_2O$ to alter the thickness and the chemical composition of the germanium-containing dielectric layer.

18. The method according to claim 17, wherein the germanium-containing dielectric layer is a germanium nitride layer, a germanium oxynitride layer, a silicon germanium nitride layer, a silicon germanium oxynitride layer, or a mixture of germanium and a high-k material.

19. The method according to claim 18, wherein the high-k material comprises $Ta_2O_5$, $TiO_2$, $ZrO_2$, $HfO_2$, $Al_2O_3$, $Y_2O_3$, $HfSiO_x$, $ZrSiO_x$, $TaSiO_x$, $SrO_x$, $SrSiO_x$, $LaO_x$, $LaSiO_x$, $YO_x$, or $YSiO_x$, or a combination of two or more thereof.

* * * * *